(12) United States Patent
Ohkubo et al.

(10) Patent No.: US 6,912,237 B2
(45) Date of Patent: Jun. 28, 2005

(54) SEMICONDUCTOR LASER MODULE AND SEMICONDUCTOR LASER DEVICE HAVING LIGHT FEEDBACK FUNCTION

(75) Inventors: Michio Ohkubo, Tokyo (JP); Yutaka Ohki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/062,397

(22) Filed: Jan. 31, 2002

(65) Prior Publication Data

US 2004/0196884 A1 Oct. 7, 2004

(30) Foreign Application Priority Data

Feb. 6, 2001 (JP) .......................... 2001-029682
Jun. 4, 2001 (JP) .......................... 2001-168644

(51) Int. Cl.$^7$ .............................. H01S 5/00
(52) U.S. Cl. .......................... 372/45; 372/43
(58) Field of Search .................... 372/45, 43, 75, 372/29.011, 46, 108, 44, 47, 49, 68, 10, 24.01

(56) References Cited

U.S. PATENT DOCUMENTS

| | | | |
|---|---|---|---|
| 4,881,238 A | 11/1989 | Chinone et al. | 372/68 |
| 4,961,197 A | 10/1990 | Tanaka et al. | 372/45 |
| 5,073,892 A | 12/1991 | Uomi et al. | 372/45 |
| 5,173,912 A | 12/1992 | Iwase et al. | 372/45 |
| 5,175,740 A | 12/1992 | Elman et al. | 372/45 |
| 5,247,530 A | * 9/1993 | Shigeno et al. | 372/36 |
| 5,436,924 A | * 7/1995 | Kamei et al. | 372/46 |
| 5,717,804 A | * 2/1998 | Pan et al. | 385/94 |

(Continued)

FOREIGN PATENT DOCUMENTS

| | | |
|---|---|---|
| EP | 0358842 A3 | 3/1990 |
| EP | 0545262 A1 | 6/1993 |
| EP | 0793314 A1 | 9/1997 |
| EP | 0812040 A2 | 12/1997 |
| EP | 0936709 A2 | 8/1999 |
| EP | 1067644 A1 | 1/2001 |
| EP | 1318580 A2 | 6/2003 |
| EP | 1437810 A1 | 7/2004 |
| WO | WO 00/77897 A1 | 12/2000 |

OTHER PUBLICATIONS

M.C. Wu et al., "A period index separate confinement heterostructure quantum well laser", Appl. Phys. Lett., vol. 59, No. 9, Aug. 26, 1991, pp. 1046–1048.

"Detuning Characteristics of Fiber Bragg Grating Stabilizing 980nm pump lasers." Mohrdiek S. et al., Optical Fiber Communication Conference Technical Digest Postconference Edition., vol. 3, Mar. 7, 2000, pp. 168–170. ISBN: 1–55752–630–3.

*Primary Examiner*—Don Wong
*Assistant Examiner*—Tuan N. Nguyen
(74) *Attorney, Agent, or Firm*—Oblon, Spivak, McClelland, Maier & Neustadt, P.C.

(57) ABSTRACT

A semiconductor laser module is provided for emitting pumping laser light which excels in temporal stability. The semiconductor laser module comprises a semiconductor laser device which has a layered structure formed on a GaAs substrate, wherein the layered structure has an active layer in a quantum well structure, formed of semiconductor materials including Ga and As, and a member having a light feedback function. The two components are optically coupled. A well layer in the active layer of the semiconductor laser device is a thick layer having a thickness of 10 nm or more. The active layer is doped with Si, and an n-type cladding layer underlying the active layer is also doped with Si.

55 Claims, 16 Drawing Sheets

U.S. PATENT DOCUMENTS

| | | | |
|---|---|---|---|
| 5,745,625 A | * 4/1998 | Aikiyo et al. | 385/94 |
| 5,751,753 A | 5/1998 | Uchida | 372/45 |
| 5,764,676 A | 6/1998 | Paoli et al. | 372/50 |
| 5,790,302 A | 8/1998 | Tiemeijer | 359/344 |
| 5,841,802 A | 11/1998 | Whiteley et al. | 372/45 |
| 5,845,030 A | * 12/1998 | Sasaki et al. | 385/88 |
| 5,926,493 A | * 7/1999 | O'Brien et al. | 372/45 |
| 5,930,430 A | * 7/1999 | Pan et al. | 385/94 |
| 5,993,073 A | * 11/1999 | Hamakawa et al. | 385/88 |
| 6,072,817 A | * 6/2000 | Adachi et al. | 372/45 |
| 6,081,541 A | * 6/2000 | Adachi et al. | 372/45 |
| 6,118,800 A | * 9/2000 | Kidoguchi et al. | 372/46 |
| 6,252,895 B1 | 6/2001 | Nitta et al. | 372/50 |
| 6,337,868 B1 | 1/2002 | Mizutani | 372/27 |
| 6,400,736 B1 | * 6/2002 | Aherne et al. | 372/6 |
| 6,472,691 B2 | * 10/2002 | Mukaihara et al. | 257/115 |

* cited by examiner (PRIOR ART)

*(FROM PRIOR ART DEVICE)*

*(FROM PRIOR ART DEVICE)*

*(FROM PRIOR ART DEVICE)*

*(FROM PRIOR ART DEVICE)*

*(FROM PRIOR ART DEVICE)*

*(FROM PRIOR ART DEVICE)*

*(FROM PRIOR ART DEVICE)*

*(FROM PRIOR ART DEVICE)*

*(FROM PRIOR ART DEVICE)*

SEMICONDUCTOR LASER MODULE AND SEMICONDUCTOR LASER DEVICE HAVING LIGHT FEEDBACK FUNCTION

RELATED APPLICATIONS

The present application claims the benefit of foreign priority under 35 U.S.C. section 119 to Japanese Applications 2001-29682, filed Feb. 6, 2001, and 2001-168644, filed Jun. 4, 2001, both of which are incorporated herein by reference.

FIELD OF THE INVENTION

The present invention relates to a semiconductor laser module and a semiconductor laser device having a light feedback function. More specifically, the present invention relates to a semiconductor laser module and a semiconductor laser device having a light feedback function which emit laser light in a wavelength range of 940 nm to 990 nm, the optical power of which is stable over time.

BACKGROUND OF THE INVENTION

A wavelength division multiplexing (WDM) communication scheme has been under progress as an optical communication system for transmitting a plurality of optical signals. This system comprises erbium (Er) doped fiber amplifiers (EDFA) installed at predetermined locations along an optical path. Each EDFA is connected to a pumping laser module which has a semiconductor laser device as a pumping light source. Pumping laser light is directed from the laser module into the EDFA to optically amplify signal light transmitted from a signal light source, thereby transmitting the optically amplified signal light again to the downstream side.

In this event, a semiconductor laser device incorporated in the laser module is supplied with an injected current, the value of which is varied in response to fluctuations in the optical power of the signal light source to control the optical power of the pumping laser light.

Such a strategy is effective for a semiconductor laser device which has an emission wavelength in a 1480 nm wavelength range since a wide gain bandwidth can be provided in the EDFA. However, the strategy as mentioned above cannot be employed for a semiconductor laser device which has an emission wavelength in a 980 nm wavelength range since the gain bandwidth is narrow in the EDFA at this wavelength range. The present invention is directed to finding a way to overcome this limitation and to enable the use of 980 nm pumping light in EDFA applications.

OBJECT AND SUMMARY OF THE INVENTION

The inventors propose a laser module comprising a semiconductor pumping laser device emitting light in the 980 nm wavelength band, with the wavelength of pumping laser customized to a narrow gain bandwidth. The inventors propose to optically couple a light feedback element having a predetermined reflection bandwidth, for example a fiber Bragg grating, to the light emitted by the pumping laser device. The light feedback element is located at or near an emitting end face (front facet) of the semiconductor laser device, and forms a light feedback structure by optically coupling a selected range of wavelengths back to the laser's resonator cavity, thereby customizing the wavelength of the pumping laser light emitted from the laser module. However, with this configuration, the inventors have found that when prior art 980-nm GaAs-based pumping lasers are placed in the proposed configuration, the light emitted by the overall module is not stable over time.

Accordingly, it is an object of the present invention to provide a semiconductor laser module which comprises a GaAs-based laser device having an emission wavelength in a 980 nm wavelength range and a light feedback element, optically coupled to each other, to generate pumping laser light, the wavelength of which lies in a reflection bandwidth of the light feedback element and is stabilized over time, with suppressed generation of noise. Specifically, the present invention provides a laser module which comprises a semiconductor laser device that emits multi-mode laser light within a reflection bandwidth of a light feedback element (such as a fiber Brag grating) which has a light feedback function, wherein the laser module emits pumping laser light, the optical power of which is stable at a particular wavelength over time.

It is another object of the present invention to provide a semiconductor laser device which has a light feedback function itself and emits laser light, the optical power of which is stable at a particular wavelength over time.

To achieve the above objects, the present invention provides a semiconductor laser module which comprises a semiconductor laser device having a layered structure formed on a GaAs substrate, wherein the layered structure has an active layer in a quantum well structure, formed of semiconductor materials including at least Ga and As, and a member having a light feedback function, wherein the semiconductor laser device and the member are optically coupled to each other, and a well layer in the active layer is a thick layer, specifically, having a thickness of 10 nm or more, and/or being thicker than an adjacent barrier layer.

Also, the present invention provides a semiconductor laser device having a light feedback function, wherein a layered structure having an active layer in a quantum well structure is formed on a GaAs substrate. The active layer is formed of semiconductor material including at least Ga and As, a well layer in the active layer is thick, and a grating is formed near the active layer.

DETAILED DESCRIPTION OF THE INVENTION

With a GaAs-based pumping laser device, which is a representative semiconductor laser device having an emission wavelength in a 980 nm wavelength range, when a laser module is assembled by optically coupling the GaAs-based pumping laser device with a fiber Bragg grating, the resulting laser module will produce pumping laser light, the wavelength of which lies for certain in a reflection bandwidth of the fiber Bragg grating. However, fluctuations in an injected current into the laser device, or slight mechanical vibrations added to the laser module or the fiber which could shift the alignment of the optical fiber to the laser device, would cause a problem associated with noise which could be introduced into pumping laser light generated by the laser module.

With the GaAs-based pumping laser device, this is seemingly attributable to high susceptibility to hop between single longitudinal modes, or to switch between single-longitudinal-mode operation and multiple-longitudinal-mode operation, and/or vice versa. Each of these events causes the laser's optical power to fluctuate on the order of several percent.

Bearing in mind that fluctuations in optical power of pumping laser light emitted from a pumping laser module are generally required to be within 0.5%, the foregoing problem is critical.

It is therefore envisaged that when stable pumping laser light is produced within the reflection bandwidth of the fiber Bragg grating in the aforementioned laser module, emitted laser light of the GaAs-based laser device, serving as a light source, must have been multi-mode (i.e., had multiple longitudinal modes).

A semiconductor laser module according to the present invention comprises a semiconductor pumping laser device, described later, and light feedback element (e.g., an optical component having a light feedback function) in an optically coupled configuration with the laser device. The light feedback element used in this configuration may be any member which has a wavelength selecting function and exhibits a particular reflectivity at a particular wavelength, including, for example, a fiber Bragg grating (FBG), a dielectric multi-layer film filter, a distributed Bragg reflector (DBR), and so on.

Figure 1:
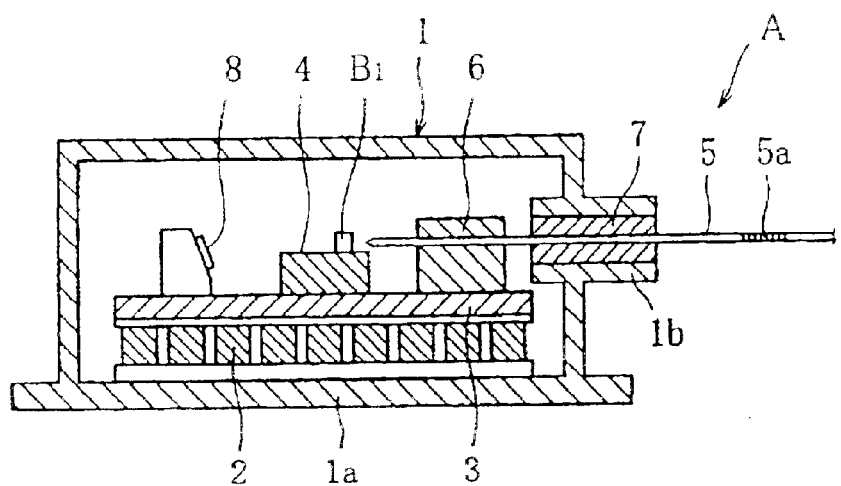
FIG. 1 is a cross-sectional view of an exemplary semiconductor laser module $B_1$ according to the present invention.

An exemplary laser module A according to the present invention is illustrated in FIG. 1.

The illustrated laser module A has a Peltier module 2 disposed on a bottom plate 1a of a package 1 for cooling a laser device $B_1$, described later, and a base material 3, made, for example, of KOVAR, on the Peltier module 2.

The laser device $B_1$ is disposed on the base material 3 through a chip carrier 4. Then, an optical fiber 5 having a fiber Bragg grating 5a is optically coupled to the laser device $B_1$ in alignment with an optical axis.

The optical fiber 5 is fixed on the base material 3 with a fiber fixing member 6, with its emitting end being drawn out from the package 1 through a sleeve 7 which is hermetically mounted in a cylindrical hole 1b of the package 1.

A photodiode 8 is disposed on the back side of the laser device $B_1$ such that the magnitude of optical power of the laser module can be monitored.

Preferably, an optical fiber having a lens-shaped leading end is employed for increasing an optical coupling efficiency of the laser device with the optical fiber. However, instead of the optical fiber having a lens-shaped leading end, the optical coupling efficiency between the two components can be increased by a lens interposed in the middle of them.

In addition, employment of a wedge-shaped optical fiber results in an assembled laser module exhibiting a high optical coupling efficiency, a reduction in the number of parts required for the assembly, and a total reduction of manufacturing cost.

Figure 2A:
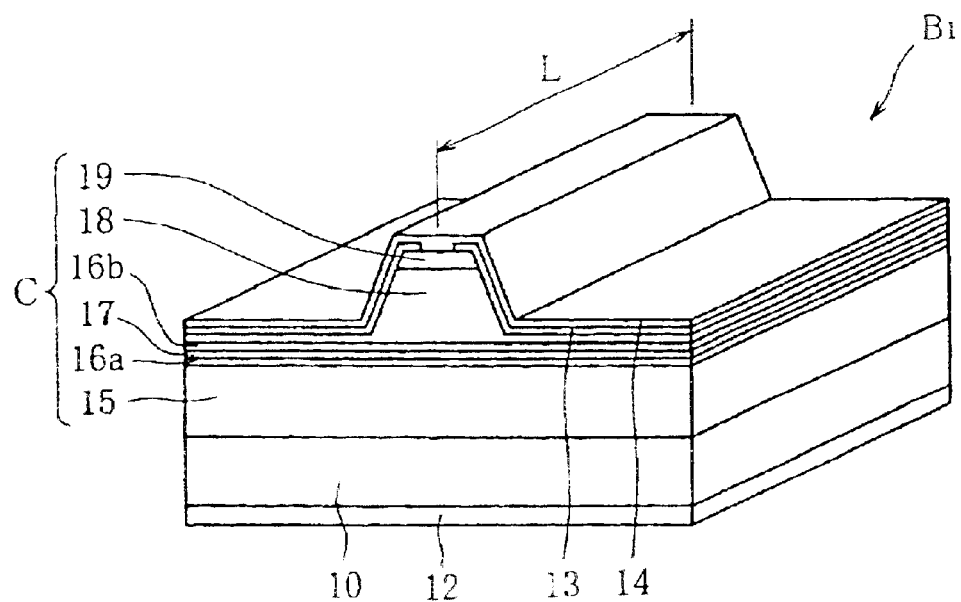
FIG. 2A is a perspective view illustrating an exemplary laser device according to the present invention.

An exemplary laser device $B_1$ according to the present invention, assembled in the laser module A, is illustrated in FIG. 2A.

The laser device $B_1$ has its top shaped in a ridge waveguide, and has a predetermined cavity length (L) as a whole. Then, a layered structure C, described later, is formed on a substrate 10 made of n-GaAs. A lower electrode 12 made, for example, of AuGeNi/Au is formed on the back face of the substrate 10. An upper electrode 14 made, for example, of Ti/Pt/Au is formed on the top of the layered structure C through a protection film 13 made, for example, of silicon nitride ($SiN_x$).

The layered structure C comprises epitaxially grown crystal layers of semiconductor materials including at least gallium (Ga) and arsenic (As). Specifically, the layered structure C is comprised of a lower cladding layer 15 made, for example, of n-AlGaAs; a lower GRIN-SCH layer 16a made, for example, of i-AlGaAs; an active layer 17, described later; an upper GRIN-SCH layer 16b made, for example, of undoped (i) AlGaAs; an upper cladding layer 18 made, for example, of p-AlGaAs; and a cap layer 19 made, for example, of p-GaAs, laminated in this order.

It should be noted that the protection film 13 formed to cover the top surface of the layered structure C does not cover a portion of the top surface of the ridge waveguide. The cap layer 19 appearing from the region not covered with the protection film 13 is directly in contact with the upper electrode 14 from which an injected current can be supplied to the active layer 17 of the layered structure C.

Then, an emitting end face (front facet) is covered with a dielectric film (not shown) having the reflectivity of 0.8%, by way of example, while the other end face (rear facet) is covered with a dielectric film (not shown) having the reflectivity of 92%, by way of example, such that the optical power of laser light generated within a cavity can be efficiently extracted from the front facet. In preferred embodiments of the present invention, the reflectivity at the rear facet has a value of 90% or more, and the reflectivity at the front facet has a value of 4% or less, and more preferably 3% or less. These reflectivity values are measured at the center wavelength of light generated by the semiconductor pumping laser.

With the structure shown in FIG. 2A, a resonator cavity (with length L) is formed between the front and rear facets. The resonator cavity includes at least a portion of layered structure C, and has its propagation axis oriented parallel to the surface of the GaAs substrate, and also oriented parallel to the cavity length. The effective refractive index for light propagating along the propagation axis of the cavity is substantially uniform for the entire cavity length, or at least a substantial portion thereof (e.g., 50% or more of L). In the latter case, a Bragg grating may be incorporated onto the semiconductor substrate near the front facet. In the grating section of the resonator cavity, the effective refractive index for the propagating light is not uniform. In most implementations of the present invention, the distance of uniform refractive index is at least 400 $\mu$m. In addition, the resonator cavity and the layer compositions of layered structure C are selected to cause the laser device to generate light which has either a single transverse electric (TE) mode or a single transverse magnetic (TM) mode. Mixed TE/TM mode operation is generally not desirable for pumping lasers. In addition, multiple transverse modes are undesirable for pumping lasers. The width of a portion of the resonator cavity, or the width of the entire cavity, is preferably selected such that only a fundamental transverse mode (either fundamental TE mode or fundamental TM mode) is supported by the cavity, and such that multiple transverse modes are not supported. The length of this portion of the resonator cavity is preferably one-half of the cavity length L or more, for example, such as about 400 $\mu$m or more.

The active layer 17 has a quantum well structure having one or more well layers, and one or more barrier layers (generally two or more barrier layers), laminated together in an alternating manner (e.g., barrier layer, well layer, barrier layer, etc.). As seen in FIG. 2A, a portion of the quantum well structure is disposed within the resonator cavity. A well layer is distinguished from a barrier layer in that the energy level of the conduction band of the well layer is lower than the energy level of the conduction band of the barrier layer. In view of the temporal stability of the pumping laser light from the laser module A, a quantum well structure having a single well layer and two barrier layers on either side of the well layer is preferred.

The well layer is generally formed, for example, of InGaAs, GaAsSb, InGaAsSb, InGaAsP, InGaAsSbP, GaAsSbP or the like, when an emission wavelength is within a 980nm wavelength range, whereas the well layer may be formed of i-GaAs when the emission wavelength is within a 870 nm wavelength range. Also, while the barrier layer is generally formed of i-InGaAs when the emission wavelength is in the 980 nm wavelength range, the barrier layer may be formed of the other semiconductor materials enumerated above in relation to the emission wavelength. In preferred embodiments of the present invention which emit in the wavelength range of 940 nm to 990 nm, the well layer comprises $In_xGa_{1-x}As$, where the atomic ratio of indium (In) with respect to all the group-III atoms is equal to or less than 0.20 (i.e., 20% indium content of group-III elements). (The arsenic atoms are group-V atoms). In preferred embodiments of the present invention, such as those which comprise $In_xGa_{1-x}As$ well layers, each well layer has a strain of +0.5% to +1.5% (compressive) with respect to the GaAs substrate, and more preferably has a strain of +1% to +1.5%, although a range of +0.75% to +1.25% may also be preferred. Here, we use the conventional definition of the strain ($\epsilon$) of the well layer with respect to the substrate. The strain may be computed from the average lattice constants of the well material and the substrate material as follows:

$$\text{strain } \epsilon(\text{in percentage}) = 100\% \cdot (Aw - Asub)/Asub,$$

where Aw is the average lattice constant of the material of the well layer, and where Asub is the average lattice constant of the material of the substrate. A negative value indicates tensile strain, while a positive value indicates compressive strain. (Because the layers that are disposed between the substrate and the well layer are relatively thin, these intermediate layers conform to the average lattice constant of the substrate, and effectively present the average lattice constant of substrate to the well layer.) In general, the light emitted from a laser having any one of the cavity structures disclosed herein is single transverse electric (TE) mode when compressive strain is present in the well layer(s).

The resonator cavity and the layered structure C of the present invention enable the light generated in the cavity to be substantially discretized into a plurality of longitudinal modes, or Fabry-Perot (F-P) modes. Each longitudinal mode has a corresponding wavelength and a corresponding number of half-cycles of that wavelength which fit within the length L of the cavity. The longitudinal modes are different from the transverse modes, and are counted (i.e., defined) along an axis which is perpendicular to the transverse axis. In the operating wavelength band of the laser device, the wavelength interval ($\Delta\lambda_{FP}$) between adjacent longitudinal modes is equal to:

$$\Delta\lambda_{FP}=\lambda^2/(2\ nL),$$

where "$\lambda$" is the center wavelength of the band, "n" is the effective index of refraction encountered by the light as it propagates along the cavity's propagation axis, and "L" is the cavity length (i.e., the length of the laser device between its optical facets). For emission in the 980 nm band ($\lambda$=980 nm) with an effective index of refraction of n=3.5, the interval $\Delta\lambda_{FP}$ is in the range of 0.17 nm to 0.08 nm for values of L in the range of 800 μm to 1800 μm.

As indicated above, the light feedback element is optically coupled to the output of the semiconductor laser device. The light feedback element has a peak reflectance at a center wavelength in the 980 nm band, and has a reflectance bandwidth around the center wavelength. Typically, the reflectance bandwidth has a value of 1 nm to 3 nm, and is measured between the two reflectance points which are on respective sides of the peak and which are equal to one-half (½) of the peak reflectance. For example, if the peak reflectance is 7%, the reflectance bandwidth is measured between the two reflectance points of 3.5%, one on each side of the peak. (The one-half values are the same as the −3 dB points.) Given the above exemplary values of $\Delta\lambda_{FP}$, a reflectance bandwidth of 1 nm encompasses 5 to 12 longitudinal modes for L in the range of 800 μm to 1800 μm, whereas a reflectance bandwidth of 2 nm encompasses 11 to 25 modes, and a reflectance bandwidth of 3 nm encompasses 17 to 37 modes. In preferred embodiments, a reflectance bandwidth of 1.5 nm is used (8 to 18 modes). With the provision of the longitudinal modes having a spacing interval $\Delta\lambda_{FP}$ and a reflectivity bandwidth of the feedback element which is equal to or greater than twice $\Delta\lambda_{FP}$, the semiconductor laser module (i.e., the laser component) is able to generate light having a plurality of the longitudinal modes. In preferred embodiments, the reflectivity bandwidth is equal to or greater than $4\cdot\Delta\lambda_{FP}$. As described in greater detail below, the use of quantum wells with thicknesses of 10 nm or more is essential in ensuring that the module component generates light with a plurality of longitudinal modes. The generation of multiple longitudinal modes is an important feature of the present invention.

With the cavity and layer construction according to the present invention, module components according to the present invention can emit maximum output power levels which are equal to or greater than (0.1 mW/μm).L, and preferably equal to or greater than (0.25 mW/μm).L, where L is the cavity length of the semiconductor device. For example, a module component which uses a laser device with a 800 μm cavity length has a maximum output power of 80 mW, and more preferably a maximum output power of 200 mW. And a module component which uses a laser device with a 1200 μm cavity length has a maximum output power of 120 mW, and more preferably a maximum output power of 300 mW. And a module component which uses a laser device with a 1800 μm cavity length has a maximum output power of 180 mW, and more preferably a maximum output power of 450 mW.

A preferred semiconductor laser device $B_1$ is further characterized in that one or more of the following inventive features are provided by the layered structure C.

(1) First Inventive Feature of the Layered Structure

First, as a principal inventive feature of the layered structure, the well layer is thicker than that of conventional prior art GaAs-based laser devices for the 980 nm emission band. Specifically, the well layer has a thickness of 10 nm or more. In this event, it goes without saying that an upper limit of the thickness of the well layer is restricted by a critical thickness of a particular semiconductor material used in forming the well layer. For example, for well layers constructed of GaInAsP and GaAsSb, the upper limit is approximately 20 nm. In preferred implementations, the well thickness $T_W$ is between 12 nm and 15 nm. Two barrier layers are preferably formed (laminated) on either side of the well layer, each barrier layer preferably having a thickness $T_B$ of 10 nm or more. The well layer is preferably thicker than at least one of the barrier layers ($T_W > T_{B1}$ and/or $T_W > T_{B2}$), and preferably thicker than both of the barrier layers ($T_W > T_{B1}$ and $T_W > T_{B2}$).

When the quantum well structure comprises two or more well layers, each well layer has a thickness of 10 nm or more, and preferably has a thickness in the range of 12 nm to 15 nm. The barrier layer disposed between adjacent well layers preferably has a thickness of 10 nm or more. The two well layers on either side of a barrier layer are preferably thicker than the barrier layer. In addition, two barrier layers are preferably formed (laminated) on either side of a laminated set of well layers.

In the above structures, the barrier layers are distinguished over the optical confinement layers and cladding layers in that the barrier layers have conduction band energies which are closer to the conduction band energy(s) of the well layer(s) than the conduction band energies of the optical confinement layers and cladding layers. In other words, the conduction band energy of a well layer is less than the conduction band energy of a barrier layer, which in turn is less than the conduction band energy of an optical confinement layer and/or a cladding layer.

The semiconductor laser device according to the present invention having the layered structure C as described above has a peak in its photoluminescence (PL) wavelength spectrum which lies in the range of 940 nm to 990 nm (at room temperature), and/or emits laser light in a wavelength range of 940 nm to 990 nm from its front facet when the injected current from the upper electrode 14 is equal to or greater than the laser's threshold current Ith (Ith is defined below). The emitted laser light in this event exhibits a multi-mode state comprised of a plurality of longitudinal modes arranged at predetermined Fabry-Perot intervals.

This results in suppression of temporal fluctuations in the pumping laser light from the laser module, which incorporates the laser device, so that the spectrum is stabilized over time.

The trend of conventional studies has aimed at reducing the thickness of the well layer in order to control the gain spectrum in a laser device. Well thicknesses substantially less than 10 nm are used in the prior art GaAs-based laser devices. However, the inventors have found that if such a laser device is optically coupled, for example, to a fiber Bragg grating (FBG) to assemble a laser module, feedback light from the fiber Bragg grating becomes single-moded, so that the spectrum of pumping laser light output from the laser module tends to fluctuate over time and fails to stabilize.

The inventors have earnestly studied to solve the above problem, and found that as the thickness of a well layer included in a laser device is increased, contrary to the prior art, pumping laser light from an FBG-based laser module, in which the well layer is incorporated, becomes multi-mode (i.e., multiple longitudinal modes), and exhibits an increased temporal stability. The advanced studies performed by the inventors eventually established the aforementioned first inventive feature in the layered structure C.

The first inventive feature of the layered structure may be used alone, or in combination with the second and third inventive features of the layered structure, which are described below.

(2) Second Inventive Feature of the Layered Structure

The second inventive feature, which is preferably used in combination with the first inventive feature, provides that at least one layer of the quantum well structure is doped with an impurity, such as an n-type impurity or a p-type impurity. The impurity preferably modifies the electrical conductivity of the material in which it is incorporated (in other words, it does not act like a group-III or group-V element of the semiconductor structure). The at least one layer may be a well layer, or may be a barrier layer. In addition, both a well layer and a barrier layer may be doped, and multiple well layers and multiple barrier layers may be doped. The doping in such a layer may be uniform, or may be varied (e.g., graded doping, or with a doped sub-layer and an undoped sub-layer). In each of these doping configurations, carriers are accumulated in at least one well layer, and possibly in two or more well layers if the structure has multiple well layers. When the active layer is doped with the impurity in any of the foregoing manners, pumping laser light from a laser module, which incorporates the laser device, fluctuates less over time so that its stability is further improved.

The impurity may be any of n-type impurities and p-type impurities. As n-type impurities, for example, one or two or more of silicon (Si), sulphur (S) and selenium (Se) may be used, while as p-type impurities, for example, one or two or more of beryllium (Be), magnesium (Mg) and zinc (Zn) may be used.

Among these impurities, an n-type impurity, Si, among others, is preferably doped in the at least one layer, since emitted laser light from the resulting laser device certainly becomes multi-moded, thereby ensuring to suppress temporal fluctuations of pumping laser light from a laser module, which incorporates the laser device, and hence to stabilize the pumping laser light. In a preferred embodiment, Si is doped into the well layer at a net doping concentration of $1 \times 10^{16}/cm^3$ to $5 \times 10^{18}/cm^3$, so that the aforementioned effects are developed remarkably. When the doping concentration of Si is lower than $1 \times 10^{16}/cm^3$, the above-mentioned effects develop insufficiently. When the doping concentration is higher than $5 \times 10^{18}/cm^3$, a reduced purity of the well layer(s) and/or barrier layer(s) occurs, leading to the loss of the function as the quantum well layer. In preferred implementations, the doping concentration ranges from $5 \times 10^{16}/cm^3$ to $1 \times 10^{18}/cm^3$, and more preferably from $2 \times 10^{17}/cm^3$ to $8 \times 10^{17}/cm^3$. In those cases where the doping in the layer is varied, the average doping of the layer (as averaged across the layer's thickness) is set within the above ranges, or the doping level in any one spot (sub-volume) of the layer is set within the above ranges.

The above impurity concentration levels are preferably less than the total concentration of charged carriers (holes and electrons) present in a well layer during normal lasing operation. In other words, the laser is operated such that the concentration of charged carriers in at least one of the well layers is greater than the concentration of impurities in that well layer, and greater than the concentration of impurities in any barrier layer adjacent to that well layer. Normal lasing operation is generally from 50% to 100% of maximum optical output power (as measured in milli-watts), and the above-described constructions of the layered structure and resonator cavity readily provide these concentrations of charged carriers at 50% of maximum optical output power.

(3) Third Inventive Feature of the Layered Structure

The third inventive feature, which is preferably used in combination with the first inventive feature of the layered structure, provides that one or more of the layers located above or below the active layer be doped with an impurity. These layers which are above or below the active layer are preferably the ones which function to confine the laser light generated by the active layer. These layers may be optical confinement layers (e.g., GRIN-SCH layers) and/or cladding layers. The level of impurity doping is generally in the range of $1 \times 10^{16}/cm^3$ to $5 \times 10^{18}/cm^3$, and preferably in the range of $5 \times 10^{16}/cm^3$ to $1 \times 10^{18}/cm^3$, and more preferably within the range of $1 \times 10^{17}/cm^3$ to $6 \times 10^{17}/cm^3$.

As an exemplary application of the third inventive feature to the laser device $B_1$ illustrated in FIG. 2A, an impurity is doped into any or all of the following layers: the lower cladding layer 15 made, for example, of n-AlGaAs; the lower GRIN-SCH layer 16a made, for example, of i-AlGaAs; the upper GRIN-SCH layer 16b made, for example, of i-AlGaAs; and the upper cladding layer 18 made, for example, of p-AlGaAs.

As a preferred example, the cladding layer, more particularly the n-type lower cladding layer, is doped with an n-type impurity Si, since multi-moded emitted laser light can be realized without fail. In this example, the doping concentration of Si is preferably on the order of $1 \times 10^{17}/cm^3$ to $4 \times 10^{17}/cm^3$, and more preferably, $2 \times 10^{17}/cm^3$ to $4 \times 10^{17}/cm^3$.

Combination of Inventive Features of the Layered Structure

Preferred laser devices $B_1$ according to the present invention include the first inventive feature of the layered structure as an essential feature. This feature ensures that the pumping laser from an assembled laser module will have temporal stability.

In further preferred embodiments, either one or both of the second and third features are added to the first feature, since the temporal stability of the pumping laser light is increased compared to the case where the first feature alone is used. More preferably, all three features are used together since the temporal stability of the pumping laser light is increased remarkably.

Characteristics

We would next like to describe characteristics of exemplary laser devices $B_1$ according to the present invention which result from the use of various combinations of the above-described three features. However, before providing this description, we formally define the threshold current Ith of a laser device, the Amplified Spontaneous Emission (ASE) spectrum, and the spectral width $\Delta\lambda$ of the ASE spectrum. The characteristics resulting from the three features will, in part, be described in terms of the ASE spectrum and $\Delta\lambda$.

Figure 3A:
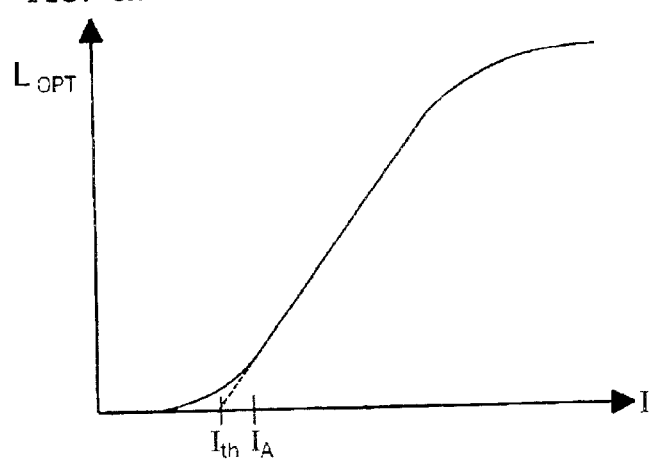
FIG. 3A is a graph defining the threshold current of the laser diode.

We use the conventional definition of threshold current Ith. That is, if one plots a graph of the optical output power $L_{OPT}$ of the laser as a function of the driving current I, the $L_{OPT}$–I curve, one finds that above a certain current level $I_A$, the optical output power $L_{OPT}$ increases with current I in a substantially linear manner. This curve is shown in FIG. 3A. A straight line is fitted to the segment of this linear characteristic, and the intercept of this line with I axis (at the value of $L_{OPT}$=0) is defined as the threshold current Ith.

Figure 3B:
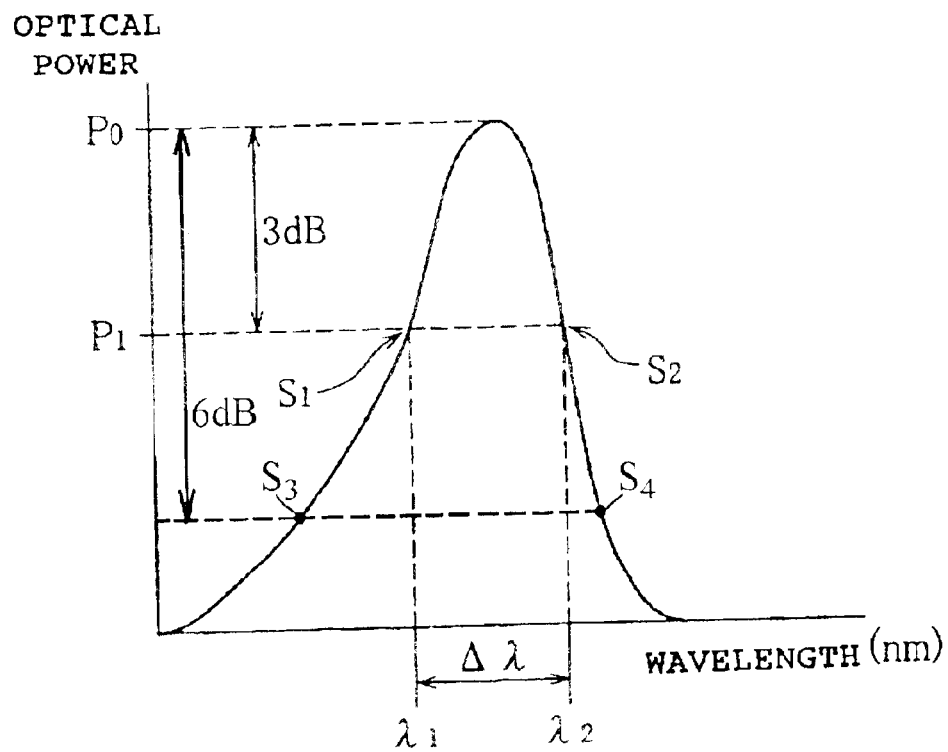
FIG. 3B is a graph showing a spectrum curve of spontaneous emission light.

As the laser device is injected with a current I having a value smaller than a threshold current value Ith (I<Ith), the laser device emits amplified spontaneous emission (ASE) light. A spectrum curve of ASE is drawn with the optical power taken on the vertical axis and the wavelength on the horizontal axis. The resulting spectrum curve generally exhibits, as shown in FIG. 3B, an asymmetric curve having a maximum intensity ($P_0$) of the optical power. A plurality of F-P longitudinal modes are included in this curve.

Points ($S_1$, $S_2$) on this spectrum curve at which optical power ($P_1$) is 3 dB lower than the maximum power ($P_0$) are found, and then the wavelengths ($\lambda_1$, $\lambda_2$ in nm) of spontaneous emission light corresponding to the respective points $S_1$, $S_2$ are revealed.

The width of the spectrum of the spontaneous emission light from point $S_1$ to point $S_2$ is denoted herein as $\Delta\lambda$, and it includes the range of optical powers from the maximum ($P_0$) to the −3 dB points on either side (i.e., $P_1$ and $P_2$). As can be seen from the figure, $\Delta\lambda$ is identified as the quantity ($\lambda_1$–$\lambda_2$).

Having thus described Ith, the ASE, and $\Delta\lambda$, we now describe the characteristics resulting from the above described three inventive features. When laser device $B_1$ includes the first inventive feature, and when the injected current (I) satisfies the relationship of $0.2 \leq I/Ith \leq 0.8$, the laser device $B_1$ has a characteristic of emitting spontaneous emission light with the $\Delta\lambda$ value at 15 nm or more for all of the I values in the range specified by the relationship.

With the $\Delta\lambda$ value less than 15 nm, if the laser device is driven with the injected current of the Ith value or more to emit laser light, the number of longitudinal (F-P) modes included within the $\Delta\lambda$ value is reduced. Then, as the laser device is optically coupled to a fiber Bragg grating, for example, to assemble a laser module, the laser module, when driven, emits pumping laser light which exhibits the single longitudinal mode or alternates the single longitudinal mode and the multiple longitudinal modes over time, resulting in unstable optical power and occurrence of noise.

However, with the $\Delta\lambda$ value equal to or more than 15 nm, a large number of longitudinal modes are included within the $\Delta\lambda$ value on the spectrum curve of the emitted laser light from the laser device $B_1$, so that the emitted laser light is multi-mode (multiple longitudinal modes) at all times. For this reason, the pumping laser light generated from the foregoing laser module maintains a stable state within the reflection bandwidth of the fiber Bragg grating even if it experiences more or less disturbance, for example, a shift of the optical fiber while the module is being driven, or a mechanical vibration which the module is being driven. In other words, the instability of the pumping laser light is significantly suppressed.

Here, the emitted laser light from the laser device $B_1$ exhibits the characteristics described above basically because the thickness of the well layer is set at 10 nm or more (the first inventive feature of the layered structure). In other words, the inventors have recognized that the thickness of the well layer is a factor which affects and limits the magnitude of the $\Delta\lambda$ value.

When the thickness of the well layer is less than 10 nm, the $\Delta\lambda$ value is reduced to less than 15 nm during ASE, causing difficulties in realizing multi-mode emitted laser light (multiple longitudinal modes). As a result, the pumping laser light from the laser module fluctuates to reduce the temporal stability.

In case of the laser device $B_1$, the shape of the spectrum curve of spontaneous emission light during ASE varies in relation to the inclusion of the aforementioned first through third inventive features of the layered structure. The varying shape may be classified in the following manner for convenience. The classification will be described below.

Figure 4:
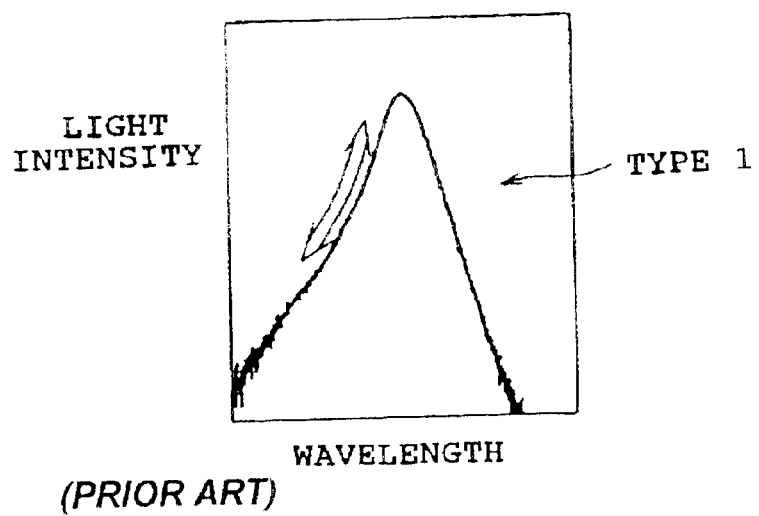
FIG. 4 is a graph showing a type 1 spectrum curve of the laser device in spontaneous emission light according to the prior art.

[1] First, for a conventional laser device which does not have any of the first through third inventive features, a spectrum curve of spontaneous emission light during ASE tends to have a shape as shown in FIG. 4.

Specifically, the shape of the spectrum curve near the maximum optical power intensity tends to be slightly concave, as indicated by a double head arrow ⇆ symbol in the figure. The type of spectrum curve which presents such tendency is hereinafter referred to as "type 1." As used herein, we define the term "concave" to mean that the second derivative of the curve is positive. A section of a curve which is concave has the property that a straight line drawing between any two points on that section is located above the curve.

Figure 5:
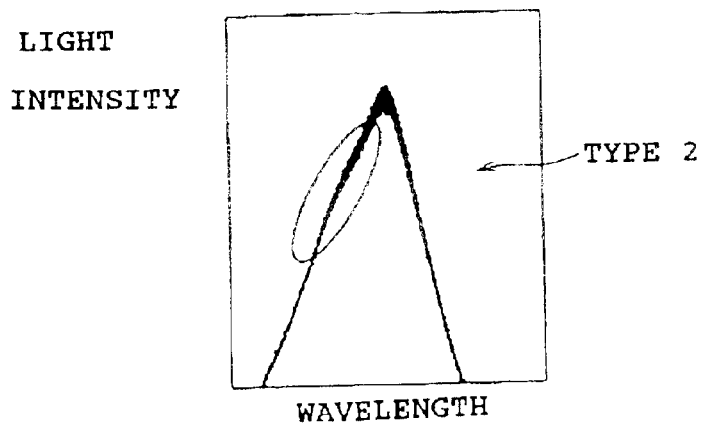
FIG. 5 is a graph showing a type 2 spectrum curve of the laser device in spontaneous emission light.

[2] For a laser device which does not have the first and second features but has only the third inventive feature, a spectrum curve of spontaneous emission light during ASE tends to have a shape as shown in FIG. 5.

Specifically, the shape of the spectrum curve near the maximum optical power intensity tends to be slightly convex, as indicated by an ellipse in the figure. The type of spectrum curve which presents such tendency is hereinafter referred to as "type 2." As used herein, we define the term "convex" to mean that the second derivative of the curve is negative. A section of a curve which is convex has the property that a straight line drawing between any two points on that section is located below the curve.

Figure 6:
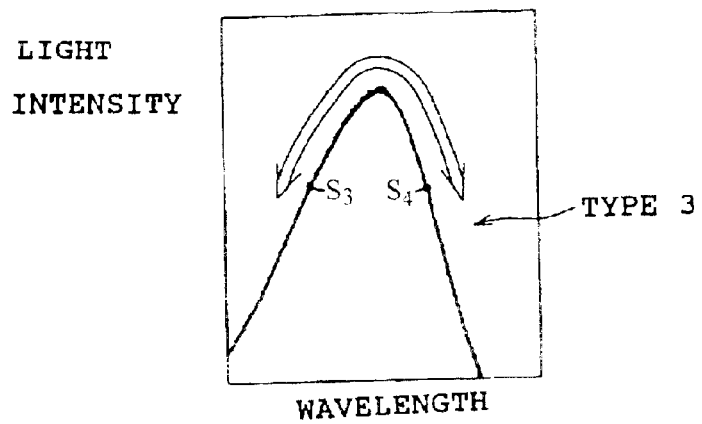
FIG. 6 is a graph showing a type 3 spectrum curve of the laser device in spontaneous emission light according to the present invention.

[3] For the laser device $B_1$ which essentially has the first inventive feature and has either the second or third inventive features, or has neither the second feature nor the third feature, a spectrum curve of spontaneous emission light during ASE tends to have a shape as shown in FIG. 6.

Specifically, the shape of the spectrum curve near the maximum optical power intensity tends to have a convex shape which is entirely rounded over the point of the maximum intensity, as indicated by a double head arrow ⇆ in the figure. The type of spectrum curve which presents such tendency is hereinafter referred to as "type 3."

Figure 7:
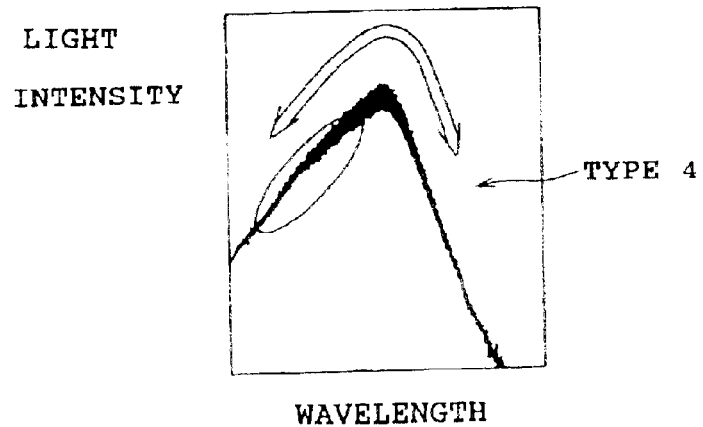
FIG. 7 is a graph showing a type 4 spectrum curve of the laser device in spontaneous emission light according to the present invention.

[4] For the laser device $B_1$ which includes the first through third inventive features, a spectrum curve of spontaneous emission light during ASE tends to have a shape as shown in FIG. 7.

Specifically, the spectrum curve has a shape which is similar to a combination of type 2 and type 3, wherein the spectrum curve tends to have a convex shape which is entirely rounded over the point of the maximum intensity, and to have a convex shape near the maximum intensity. The type of spectrum curve which presents such tendency is hereinafter referred to as "type 4."

Stated another way, the laser device $B_1$ according to the present invention has a characteristic that the spectrum curve of spontaneous emission light during ASE presents the shape which is classified as type 3 or type 4.

From a different point of view, a laser device which presents a spectrum curve of spontaneous emission light during ASE, classified as type 3 or type 4, falls under the laser device $B_1$ which has at least the first inventive feature of the layered structure. It can therefore be said that pumping laser light from a laser module assembled using such a laser device exhibits a good temporal stability. In other words, determination as to whether a laser device is effective or not for the temporal stability of pumping laser light can be made from the spectrum curve of spontaneous emission light during ASE.

In preferred embodiments of the present invention, the general shape of the ASE spectrum curve of the laser device is convex (as defined above) for wavelengths which range between the −6 dB points of the spectrum curve, as measured at one or currents in the range from 0.2.Ith to 0.8.Ith, and more particularly as measured at one or more currents in the range of 0.4.Ith to 0.6.Ith, and most particularly as measured at a current of 0.5.Ith. The −6 dB points of an ASE spectrum curve are defined in a similar manner as the −3 dB points (points $S_1$ and $S_2$) shown in FIG. 3B. The −6 dB points are the points in the spectrum which have power levels that are 6 dB below the peak. They are shown in FIG. 3B as points $S_3$ and $S_4$, as well as in FIG. 6. To reduce the effects of measurement noise, the general shape of the ASE curve is determined with a least-squares spline fit of the measured data.

Figure 8:
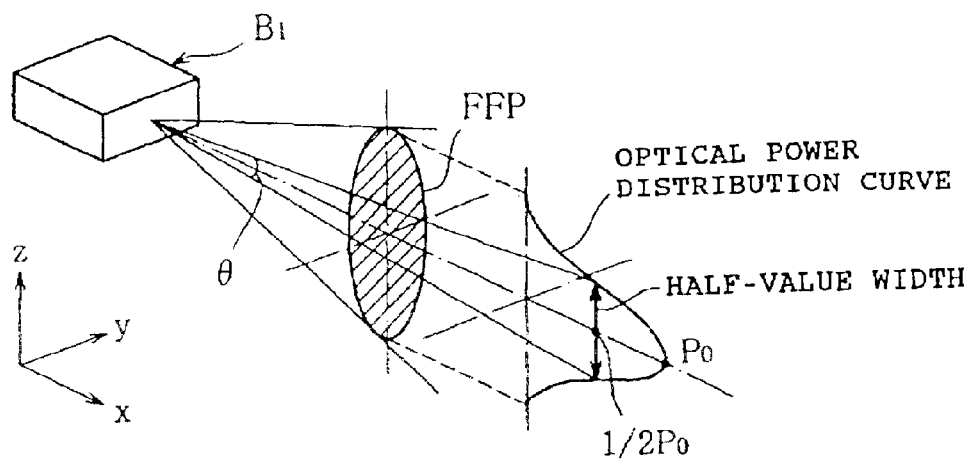
FIG. 8 is an explanatory diagram for explaining a divergence angle θ of a far-field pattern according to the present invention.

Also, the laser device $B_1$ preferably has the following characteristic which is described with reference to FIG. 8.

First, the laser device $B_1$ is driven to emit laser light. Assuming herein three-dimensional coordinate axes consisting of a longitudinal direction of the laser device $B_1$ (direction in which laser light is emitted) which is defined as the x-axis direction; a thickness direction, i.e., a direction in which layers are laminated in the layered structure C, as the z-axis direction; and a width direction as the y-axis direction, the following description will be centered on a z-axis direction component of emitted light.

The emitted light exits the laser device $B_1$, and produces a far-field pattern (FFP) on a plane orthogonal to the optical axis. A Z-axis direction component of the far-field pattern (FFP) presents an optical power distribution curve having a maximum power $P_0$.

Then, the two points along the vertical direction (Z-axis) of the FFP which are at the half power level (½.$P_0$) are found, and the divergence angle θ of the emitted light from the front facet of the laser to each of these points is found. Angle θ is also known as the "full-width half-maximum angle", because the angle is formed between the front facet and the full width between the two points on the vertical axis which are at the half-power level.

With the laser device $B_1$, the divergence angle θ is preferably 25° or smaller. This is because the divergence angle θ equal to or smaller than 25° results in a sufficiently high coupling efficiency of the laser device $B_1$ with an optical fiber to increase the optical power at the fiber end as well as a sufficiently reduced optical confinement coefficient for the active layer to increase the efficiency.

It should be noted that although the foregoing description has been made in connection with a ridge waveguide type laser device, the laser device $B_1$ is not limited to such a structure, but may be applied to any laser device of self-alignment structure type (SAS) as long as it has a layered structure which includes the aforementioned first inventive feature, and as long as it has a layered structure and resonator cavity which enable multi-mode emission with the light feedback element.

Figure 2B:
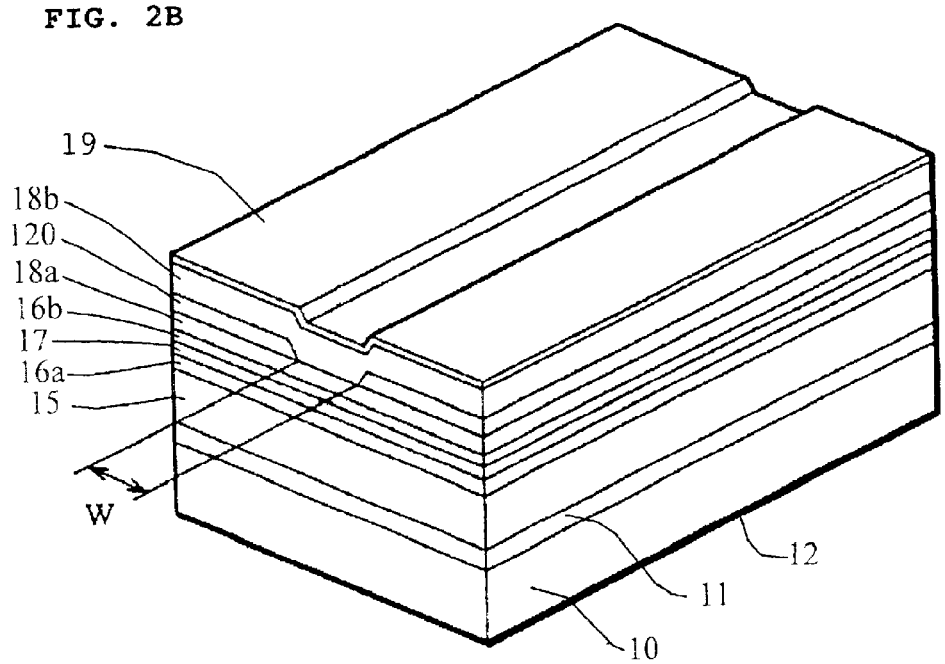
FIG. 2B is a perspective view illustrating another exemplary laser device according to the present invention.

FIG. 2B shows such a self-aligned structure (SAS). Starting from a GaAs substrate 10, the following layers are sequentially formed: a buffer layer 11 of n-GaAs with a thickness of 0.5 μm, a lower cladding layer 15 as previously described, a lower optical confinement layer 16a as previously described, an active layer 17 as previously described, and an upper optical confinement layer 16b as previously described. Then, a first upper cladding layer 18a of p-$Al_{0.3}Ga_{0.7}As$ with a thickness of 500 nm is formed over layer 16b, followed by a low refractive-index layer 120 of n-$Al_{0.35}Ga_{0.65}As$ with a thickness of 0.5 μm, which serves also as a current blocking layer. Layer 120 is then etched to form a trench with width W, and a second upper cladding layer 18b of p-$Al_{0.3}Ga_{0.7}As$ with a thickness of 2.0 μm is formed over the etched layer 120. A contact layer 19 of p-GaAs is then formed on second upper cladding layer 18b. An upper electrode (not shown) is formed on the contact layer 19, and a lower electrode 12 formed on the opposite side, that is, the lower surface of the substrate 10.

The trench in layer 120 defines a window through which current flows through the active layer 17, and thereby defines the part of layer 17 which generates light. The effect is similar to that of the ridge waveguide structure shown in FIG. 2A, where the mesa portion of cladding layer 18 essentially controls the area through which current flows through the active layer 17. Both of these cases are different from the buried hetero-structure (BH), where the active layer is pattern-etched to define its width, and where those portions of the active layer which are not intended to lase are removed. The trench in layer 120 also defines the transverse width of the resonator cavity. The lower refractive index of layer 120 causes the effective refractive index on either side of the trench to be lower than portions of layers 16a, 16b, and 17 which are located directly under the trench. A similar effect is achieved in the ridge waveguide structure of FIG. 2A. In this case, the presence of layers 13 and 14 and the absence of the upper portion of layer 18 on either side of the mesa causes the effective refractive index on either side of the mesa to be lower than portions of layers 16a, 16b, and 17 which are located directly under the mesa.

Figure 9:
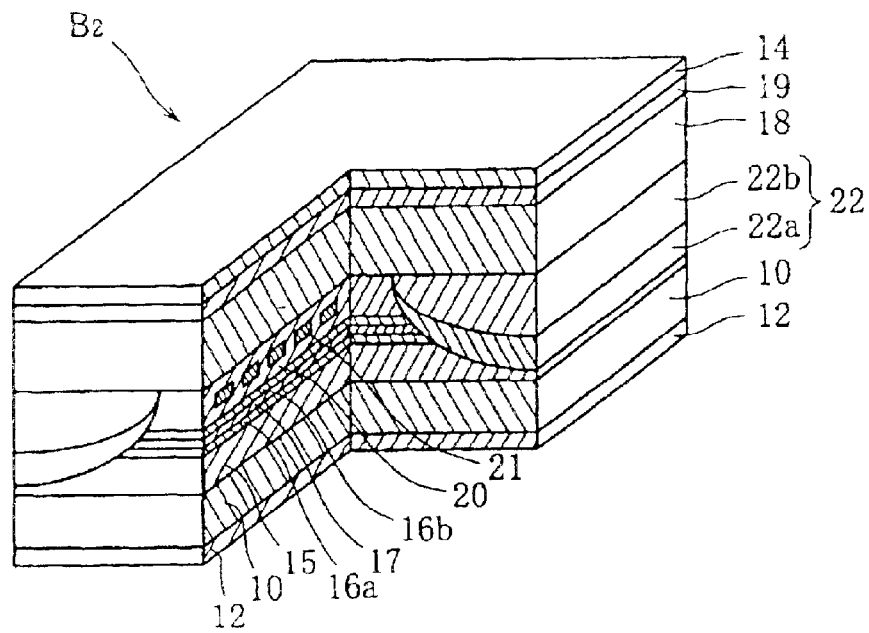
FIG. 9 is a partially cut-away perspective view illustrating an exemplary semiconductor laser device $B_2$ according to the present invention.

As indicated above, laser device $B_1$ is incorporated into a package with a light feedback element (5a) that is external to the semiconductor chip on which laser $B_1$ is formed. However, the present invention applies equally to laser devices where light feedback elements are integrated on the same semiconductor chip as the laser cavity. Such a laser device according to the present invention with integrated light feedback element will now be described with reference to laser device $B_2$, which is illustrated in the partially cut-away perspective view of FIG. 9.

The laser device $B_2$ has a spacer layer 20 interposed between the upper GRIN-SCH layer 16b and the upper cladding layer 18 in the layered structure C of the laser device $B_1$ illustrated in FIG. 2A; a grating 21 at a predetermined period disposed within the spacer layer 20; and current blocking layers 22 disposed on both sides of the active layer 17, each comprised of a laminate of a p-type layer 22a and an n-type layer 22b.

The laser device $B_2$ has a grating 21 near the active layer 17, which is a light feedback element having both a light feedback function and a wavelength selectivity. Therefore, the laser device $B_2$ itself has the light feedback element integrated with it, and outputs laser light at a particular wavelength which is defined by a reflection bandwidth of the grafting 21.

In this event, the active layer 17 includes at least the aforementioned first inventive feature of the layered structure. In addition, when the second and third inventive features are also included, laser light from the laser device $B_2$ is multi-moded, as is the case with the laser module of the present invention illustrated in FIG. 1, so that its light power suffers from less fluctuations over time.

In other words, this laser device $B_2$ is capable of performing by itself the functions equivalent to those of the laser module A illustrated in FIG. 1. Of course, the laser module illustrated in FIG. 1 can be assembled with the laser device $B_2$ used as a light source.

EXAMPLES

1. Manufacturing of Laser Device $B_1$

Respective layers shown in Tables 1 and 2 were grown on a substrate made of n-GaAs to form the layered structure C of FIG. 2A.

A ridge waveguide of 4 μm-wide and 1.2 μm-high was formed on the top surface of the formed layered structure by applying a photolithography technique and etching technique. Subsequently, a protection film 13 made of silicon nitride (SiN) was formed on the top surface.

Next, the back face of the substrate 10 was polished and was formed with a lower electrode 12 made of AuGeNi/Au.

Also, a portion of the protection film on the top surface of the cap layer 19 was removed, and an upper electrode 14 made of Ti/Pt/Au was formed on the entire top surface of the layered structure.

Then, the substrate was cleaved to form a bar which has a cavity length (L) equal to 800 μm. Subsequently, a low reflection film made of SiN and having a reflectivity of 0.8% was deposited on one end face to form a front facet, while a high reflection film made of $SiO_2$/Si and having a reflectivity of 92% was deposited on the other end face to form a rear facet. Finally, this bar was machined to fabricate the laser device $B_1$ illustrated in FIG. 2A as a chip.

TABLE 1

| | | Laser Device 1 | Laser Device 2 | Laser Device 3 | Laser Device 4 |
|---|---|---|---|---|---|
| Lower Cladding Layer 15 | Composition | n-$Al_{0.3}Ga_{0.7}As$ | n-$Al_{0.3}Ga_{0.7}As$ | n-$Al_{0.3}Ga_{0.7}As$ | n-$Al_{0.3}Ga_{0.7}As$ |
| | Thickness (μm) | 4 | 4 | 4 | 4 |
| | Si Doping Concentration (1/$cm^3$) | $1 \times 10^{17}$ | $3 \times 10^{17}$ | $1 \times 10^{17}$ | $3 \times 10^{17}$ |
| Lower GRIN-SCH Layer 16a | Composition | i-$Al_{0.2}Ga_{0.8}As$ | i-$Al_{0.2}Ga_{0.8}As$ | i-$Al_{0.2}Ga_{0.8}As$ | i-$Al_{0.2}Ga_{0.8}As$ |
| | Thickness (nm) | 30 | 30 | 50 (consisting of two layers of 25 nm) | 50 (consisting of two layers of 25 nm) |
| Active Layer 17 | Barrier Layer Composition | i-$GaAs_{0.91}P_{0.09}$ | i-$GaAs_{0.91}P_{0.09}$ | i-$GaAs_{0.91}P_{0.09}$ | i-$GaAs_{0.91}P_{0.09}$ |
| | Thickness (nm) | 10 | 10 | 10 | 10 |
| | Well Layer Composition | $In_{0.2}Ga_{0.8}As$ | $In_{0.2}Ga_{0.8}As$ | $In_{0.2}Ga_{0.8}As$ | $In_{0.2}Ga_{0.8}As$ |
| | Thickness (nm) | 7 | 7 | 12 | 12 |
| | Si Doping Concentration (1/$cm^3$) | — | — | — | $5 \times 10^{17}$ |
| | Number of well layer(s) | 2 | 2 | 1 | 1 |
| Upper GRIN-SCH Layer 16b | Composition | i-$Al_{0.2}Ga_{0.8}As$ | i-$Al_{0.2}Ga_{0.8}As$ | i-$Al_{0.2}Ga_{0.8}As$ | i-$Al_{0.2}Ga_{0.8}As$ |
| | Thickness (nm) | 30 | 30 | 50 (consisting of two layers of 25 nm) | 50 (consisting of two layers of 25 nm) |
| Upper Cladding Layer 18 | Composition | i-$Al_{0.3}Ga_{0.7}As$ | i-$Al_{0.3}Ga_{0.7}As$ | i-$Al_{0.3}Ga_{0.7}As$ | i-$Al_{0.3}Ga_{0.7}As$ |
| | Thickness (μm) | 2 | 2 | 2 | 2 |
| | Zn Doping Concentration (1/$cm^3$) | $3 \times 10^{17}$ | $3 \times 10^{17}$ | $3 \times 10^{17}$ | $3 \times 10^{17}$ |
| Cap Layer 19 | Composition | GaAs | GaAs | GaAs | GaAs |
| | Thickness (μm) | 0.5 | 0.5 | 0.5 | 0.5 |
| | Zn Doping Concentration (1/$cm^3$) | $1 \times 10^{20}$ | $1 \times 10^{20}$ | $1 \times 10^{20}$ | $1 \times 10^{20}$ |
| | Remarks | Comparative Example None of first, second, & third inventive features | Comparative Example Only third inventive feature | Example Only first inventive feature | Example All of first, second, & third inventive features |

TABLE 2

| | | Laser Device 5 | Laser Device 6 | Laser Device 7 |
|---|---|---|---|---|
| Lower Cladding Layer 15 | Composition | n-$Al_{0.3}Ga_{0.7}As$ | n-$Al_{0.3}Ga_{0.7}As$ | n-$Al_{0.3}Ga_{0.7}As$ |
| | Thickness (μm) | 4 | 4 | 4 |
| | Si Doping Concentration (1/$cm^3$) | $1 \times 10^{17}$ | $3 \times 10^{17}$ | $1 \times 10^{17}$ |
| Lower GRIN-SCH Layer 16 | Composition | i-$Al_{0.2}Ga_{0.8}As$ | i-$Al_{0.2}Ga_{0.8}As$ | i-$Al_{0.2}Ga_{0.8}As$ |
| | Thickness (nm) | 50 (consisting of two layers of 25 nm) | 50 (consisting of two layers of 25 nm) | 50 (consisting of two layers of 25 nm) |
| Active Layer 17 | Barrier Layer Composition | i-$GaAs_{0.91}P_{0.09}$ | i-$GaAs_{0.91}P_{0.09}$ | i-$GaAs_{0.91}P_{0.09}$ |
| | Thickness (nm) | 10 | 10 | 10 |
| | Well Layer Composition | $In_{0.2}Ga_{0.8}As$ | $In_{0.2}Ga_{0.8}As$ | $In_{0.2}Ga_{0.8}As$ |
| | Thickness (nm) | 12 | 12 | 12 |
| | Si Doping Concentration (1/$cm^3$) | $5 \times 10^{17}$ | — | $5 \times 10^{17}$ (Zn)* |
| | Number of well layer(s) | 1 | 1 | 1 |
| Upper GRIN-SCH Layer 16b | Composition | i-$Al_{0.2}Ga_{0.8}As$ | i-$Al_{0.2}Ga_{0.8}As$ | i-$Al_{0.2}Ga_{0.8}As$ |
| | Thickness (nm) | 50 (consisting of two layers of 25 nm) | 50 (consisting of two layers of 25 nm) | 50 (consisting of two layers of 25 nm) |
| Upper Cladding Layer 18 | Composition | i-$Al_{0.3}Ga_{0.7}As$ | i-$Al_{0.3}Ga_{0.7}As$ | i-$Al_{0.3}Ga_{0.7}As$ |
| | Thickness (μm) | 2 | 2 | 2 |
| | Zn Doping Concentration (1/$cm^3$) | $3 \times 10^{17}$ | $3 \times 10^{17}$ | $3 \times 10^{17}$ |

TABLE 2-continued

|  |  | Laser Device 5 | Laser Device 6 | Laser Device 7 |
|---|---|---|---|---|
| Cap Layer 19 | Composition | GaAs | GaAs | GaAs |
|  | Thickness ($\mu$m) | 0.5 | 0.5 | 0.5 |
|  | Zn Doping Concentration (1/cm$^3$) | $1 \times 10^{20}$ | $1 \times 10^{20}$ | $1 \times 10^{20}$ |
|  | Remarks | Example First, second inventive features | Example First, third inventive features | Example First, second inventive features |

*Zn (p-type) is used as impurity.

Figure 10:
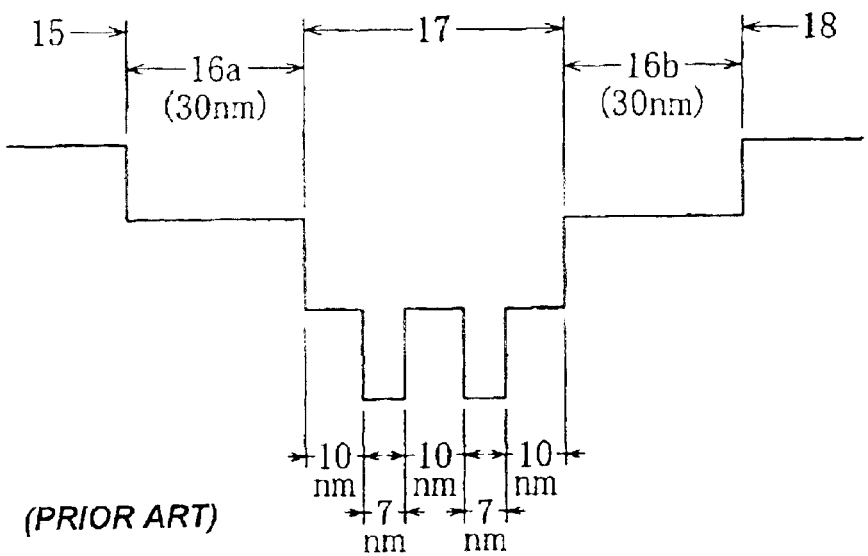
FIG. 10 is a schematic diagram showing conduction bands of laser devices 1, 2 according to the prior art.
Figure 11:
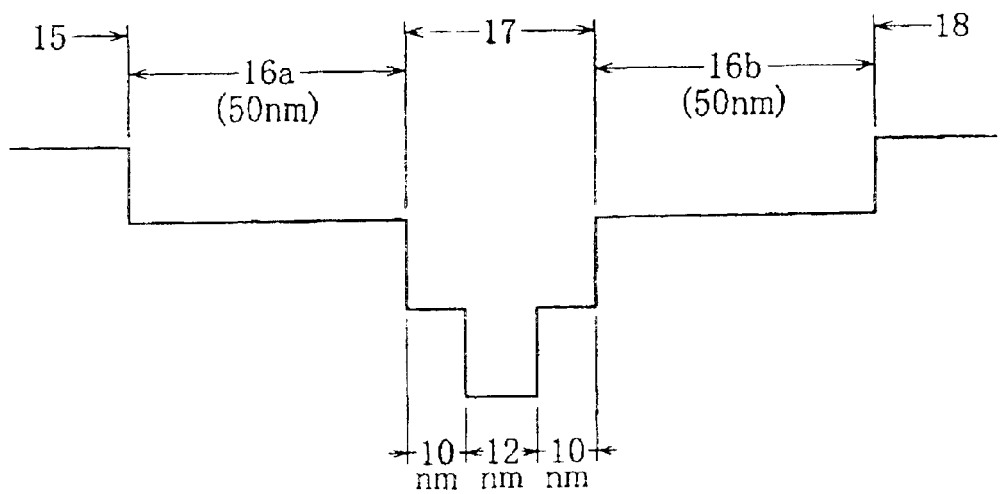
FIG. 11 is a schematic diagram showing a conduction band of a laser device 4 according to the present invention.

FIG. 10 is a schematic diagram showing a conduction band of a laser device 1, and FIG. 11 is a schematic diagram showing a conduction band of a laser device 4. Reference numerals in the figures designate the respective layers shown in FIG. 2A.

2. Characteristics of Laser Devices

The laser devices shown in Tables 1 and 2 were driven to emit ASE spontaneous emission light using AQ6317 (an optical spectrum analyzer manufactured by ANDO Co.). Spectrum curves were drawn for respective spontaneous emission light to observe their shapes. The results of the observations is shown in Table 3.

TABLE 3

|  | Shape of Spectrum Curve | Divergence angle ($\theta$:°) | Inventive Features Included |
|---|---|---|---|
| Laser Device 1 | Type 1 | 21 | None |
| Laser Device 2 | Type 2 | 21 | Only Third Inventive Feature |
| Laser Device 3 | Type 3 | 21 | Only First Inventive Feature |
| Laser Device 4 | Type 4 | 21 | All |
| Laser Device 5 | Type 3 | 21 | First and second Features |
| Laser Device 6 | Type 3 | 21 | First and third Features |
| Laser Device 7 | Type 3 | 21 | First and second Features |

Also, each of the laser devices is driven to emit laser light, and a far-field pattern of the emitted laser light was measured using a photodiode to find a divergence angle $\theta$ in the vertical direction corresponding to the full-width of the spectrum along the vertical direction, as measured between the points of half-power. The result is also shown in Table 3.

Also, for Laser Device 1, Laser Device 3, and Laser Device 4, an injected current (I) was varied to observe the spontaneous emission light, and spectrum curves were drawn for the respective spontaneous emission light. A spectrum width ($\Delta\lambda$ value) was found between the two wavelengths where the optical output power was 3 dB lower than the maximum optical output power ($P_0$). Then, the I/Ith value and spectrum width ($\Delta\lambda$ value) were plotted. The result is shown in FIG. 12.

The following are apparent from the above results.

Figure 12:
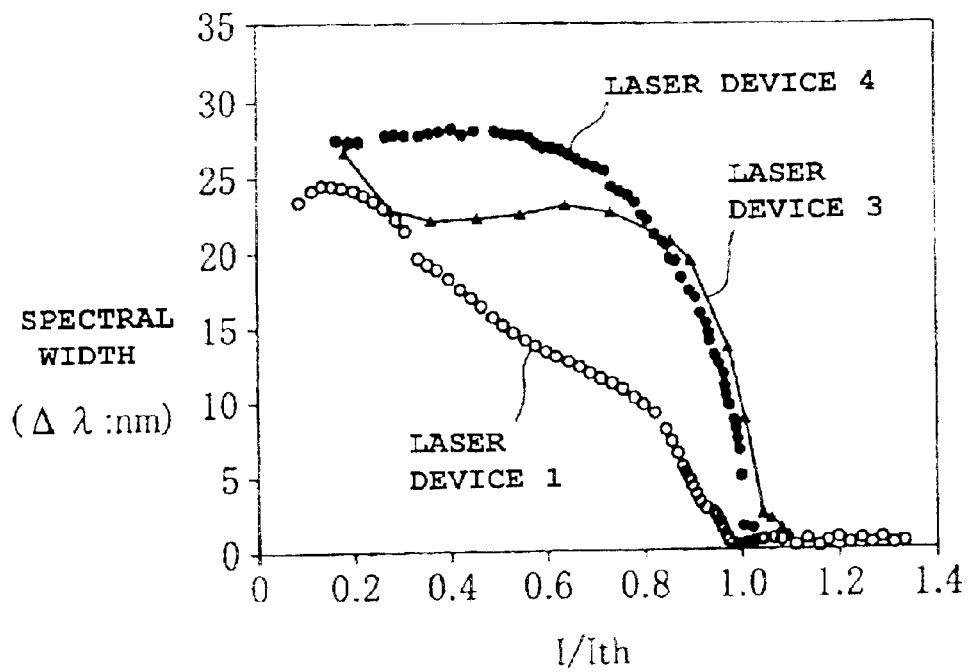
FIG. 12 is a graph showing the relationship of the value I/Ith and spectrum widths ($\Delta\lambda$) of prior art laser devices and laser devices according to the present invention.

(1) First, as is apparent from FIG. 12, Laser Devices 1, 3 and 4 all emit laser light when the I/Ith value is equal to or more than one, i.e., the injected current is equal to or more than the threshold current.

However, in a region of the injected current having an I value at which spontaneous emission light exits, Laser Device 1 has the spectrum width ($\Delta\lambda$ value) in the spontaneous emission light which decreases in a substantially linear manner as the value of current I increases toward Ith.

In contrast, the spectrum width ($\Delta\lambda$ value) for Laser Device 4 generally remains at substantially the same value for ratios of I/Ith which are between 0.2 and 0.6, and decreases to zero with an accelerating rate of decline (i.e., becomes smaller according to a curve shaped path) when the ratio I/Ith is increased from 0.6 to approximately 1.0. While Laser Device 3 presents substantially the same behavior as Laser Device 4, Laser Device 3 differs from Laser Device 4 in that the spectrum width ($\Delta\lambda$ value) undergoes two distinct stages of reduction, with a plateau between the stages. The first stage of reduction is relatively small and occurs when the ratio I/Ith increases from 0.2 to approximately 0.4. The second stage of reduction is larger, and occurs when the ratio I/Ith is increased from 0.8 to approximately 1.05. The plateau region occurs when the ratio I/Ith is between approximately 0.4 and 0.8, where the spectral width $\Delta\lambda$ is substantially constant.

(2) In any case, Laser Device 3 and Laser Device 4 provide stable values of $\Delta\lambda$ in a wide range of the ratio I/Ith (e.g., between 0.4 and 0.8). This means that even if the values of I fluctuates in this range, the shape of the spectrum curve of spontaneous emission light only changes slightly, and is stable. This may be regarded as a predictive indication of the stability of the emitted laser light when the laser devices are driven with the injected currents I which are greater than the threshold value Ith.

Comparing Laser Device 3 with Laser Device 4 in the $\Delta\lambda$ value, Laser Device 4 presents a larger value for ratios I/Ith which are between 0.2 and 0.9 (i.e., in the plateau regions), which suggests that Laser Device 4 is superior to Laser Device 3 in driving stability.

(3) Referring now to Tables 1, 2 and 3, Laser Device 1, which has a well layer of 7 nm thick and a two-layer quantum well structure, generates spontaneous emission light which exhibits a spectrum curve belonging to type 1 shape. The $\Delta\lambda$ value varies as shown in FIG. 12. On the other hand, Laser Device 3, which has a well layer of 12 nm thick (first inventive feature of the layered structure) and a single-layer quantum well structure, generates spontaneous emission light which exhibits a spectrum curve belonging to type 3 shape and a stable $\Delta\lambda$ value.

Then, Laser Device 4, which includes the first inventive feature of the layered structure as well as both of the second and third inventive features of the layered structure, generates spontaneous emission light which exhibits a spectrum curve belonging to type 4 shape and a highly stable $\Delta\lambda$ value.

(4) Stated another way, as the well layer has a larger thickness, the spectrum curve of spontaneous emission light changes to type 3 shape, and simultaneously, the $\Delta\lambda$ value is stabilized over a wide range of the I/Ith value. Then, with the first inventive feature of the layered structure present, it becomes apparent that as the well layer is further doped with Si (for providing the second inventive feature of the layered structure) and the n-type cladding layer is doped with Si in a high concentration of $3\times10^{17}/cm^3$ (for providing the third inventive feature of the layered structure), the shape of the spectrum curve of spontaneous emission light changes to a combination of type 2 and type 3, i.e., type 4, and simultaneously, the Δλ value is highly stabilized over a wide range of the I/Ith value.

While the foregoing description has been made in connection with a laser device which has the reflectivity of 0.8% on the front facet, it has been confirmed that when the reflectivity of the front facet is varied in a range of 0.5% to 15%, resulting laser devices exhibit similar characteristics to the foregoing descriptions, respectively.

Also, while the foregoing embodiments employ an n-type substrate, similar characteristics can be obtained as well with a p-type substrate, in which case, however, the conductivity types of the respective layers in the layered structure C are usually the reverse of those in the foregoing embodiments.

3. Assembly of Laser Module

Laser Device 1 and Laser Device 4 were selected from the laser devices shown in Tables 1 and 2, and each of the laser devices was optically coupled to an optical fiber formed with a fiber Bragg grating through a lens to assemble the laser module A illustrated in FIG. 1.

We designate an apparatus which incorporates Laser Device 1 as Apparatus $A_1$ (apparatus derived from prior art teachings), and an apparatus which incorporates Laser Device 4 as Apparatus $A_2$ (Example apparatus).

The fiber Bragg grating optically coupled to Laser Device 1 is designed to have a reflectivity of 7%, reflection bandwidth of 1.5 nm, and wavelength selectivity for a wavelength band centered at 979 nm. On the other hand, the fiber Bragg grating optically coupled to Laser Device 4 is designed to have a reflectivity of 7%, reflection bandwidth of 1.5 nm, and wavelength selectivity for a wavelength band centered at 976 nm.

4. Performance of Laser Modules (1) Temporal Stability of Pumping Laser Light

Apparatus $A_1$ and Apparatus $A_2$ were injected with a current of 250 mA to emit pumping laser light. Then, the optical power (Pf) of the laser light was measured by a system comprised of a Lightwave Multimeter 8153A (manufactured by Agilent Technologies), a Power Sensor Module 81533B (manufactured by Agilent Technologies), and an Optical Head 81525A. In addition, monitored light currents (Im) were measured by a system comprised of an ADVANTEST Digital Electrometer R8240 (manufactured by Advantest Corporation) and an ILX Lightwave Laser Diode Controller LDC-3744B (manufactured by ILX Lightwave Co.). Then, over a time span of approximately one minute, the rates of change (in terms of percentage, %) for the measured values of Pf and Im were calculated at an interval of 0.4 seconds.

Figure 13:
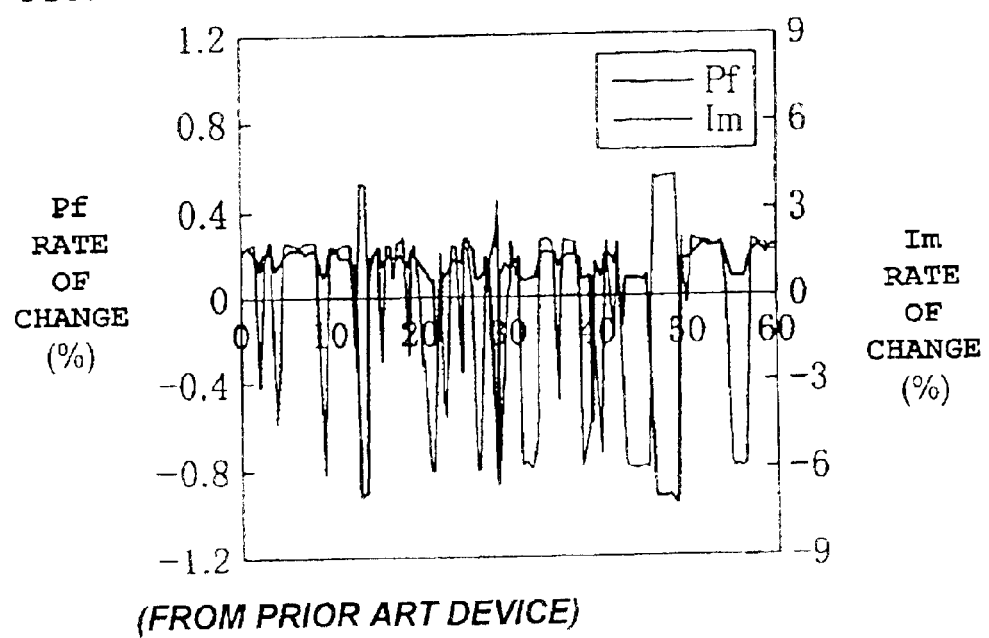
FIG. 13 is a graph showing the rates of change in the optical output power (Pf) and monitor current (Im) at a fixed drive current over time of a laser module according to the prior art.
Figure 14:
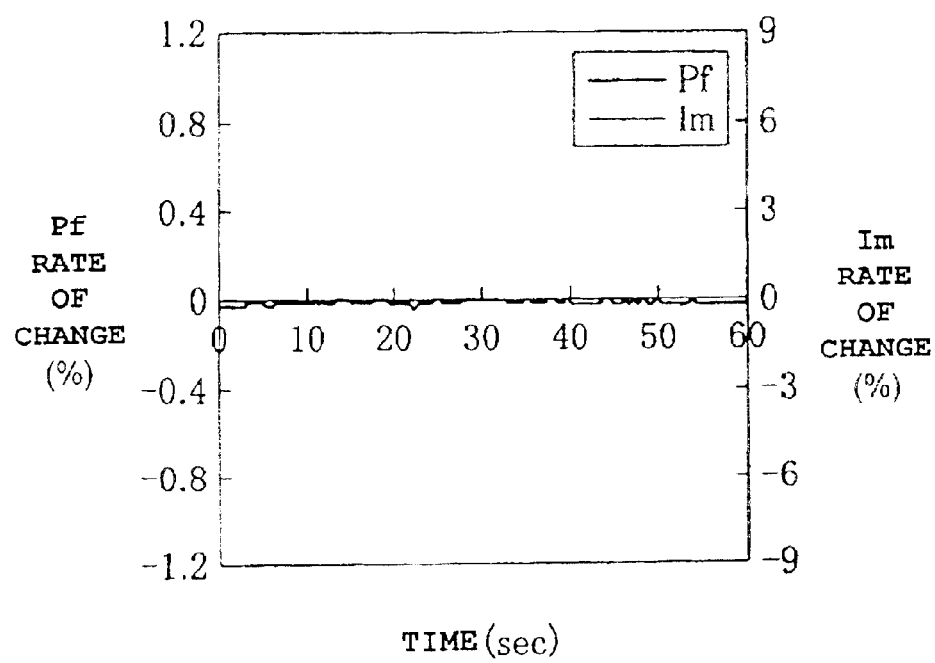
FIG. 14 is a graph showing the rates of change in the optical output power (Pf) and monitor current (Im) at a fixed drive current over time of a laser module according to the present invention.

FIG. 13 shows the result obtained from Apparatus $A_1$, and FIG. 14 shows the result obtained from Apparatus $A_2$. As is apparent from a comparison of FIG. 13 with FIG. 14, Apparatus $A_2$ is significantly superior to Apparatus $A_1$ in the temporal stability of the emitted laser light.

(2) Stability of Emitted Laser Light to Driving Current Value

Figure 15:
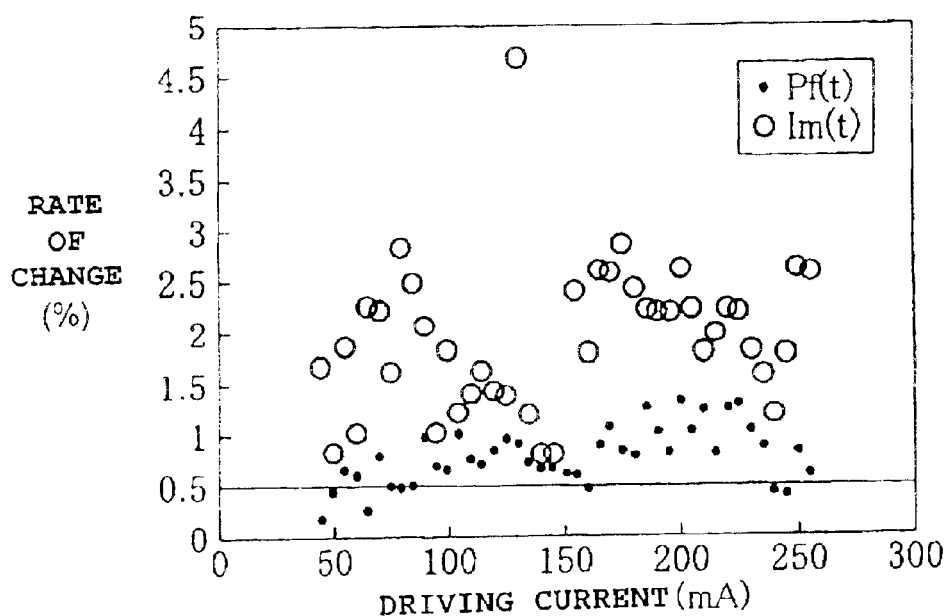
FIG. 15 is a graph showing the rates of change in the optical output power (Pf) and monitor current (Im) over a range the drive currents above threshold current of a laser module according to the prior art.
Figure 16:
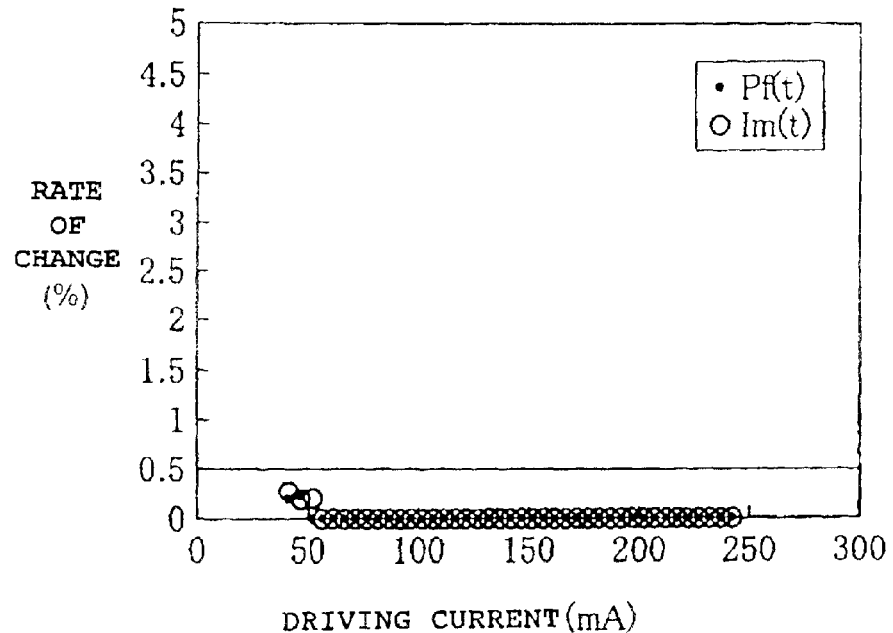
FIG. 16 is a graph showing the rates of change in the optical output power (Pf) and monitor current (Im) over a range the drive currents above threshold current of a laser module according to the present invention.
Figure 17:
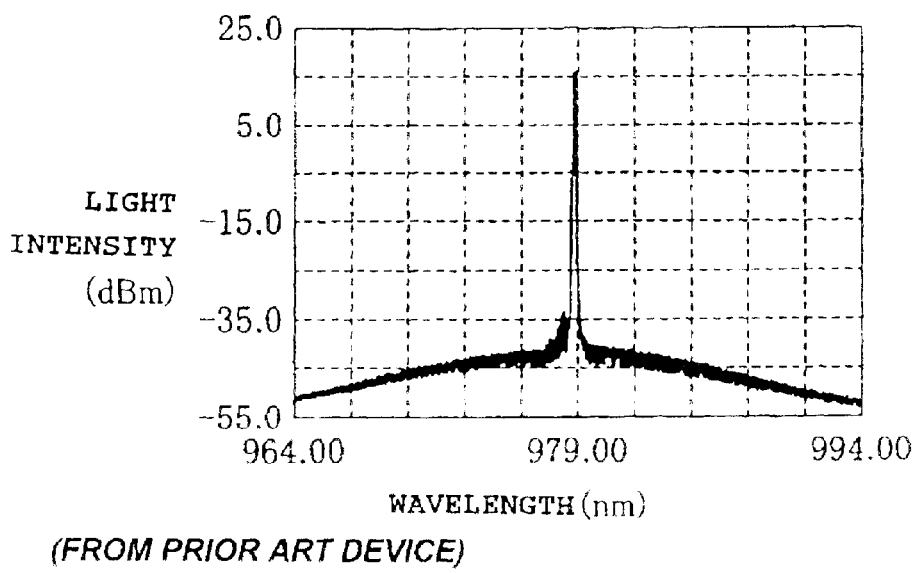
FIG. 17 is a spectrum diagram of pumping laser light of a semiconductor laser device according to the prior art at the start of lasing operation.
Figure 18:
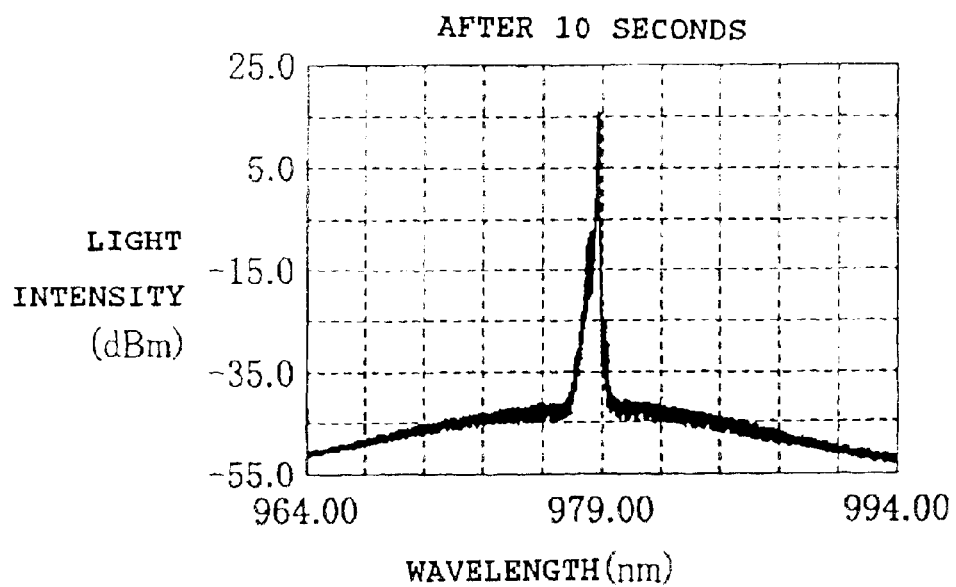
FIG. 18 is a spectrum diagram of the pumping laser light of a semiconductor laser device according to the prior art after ten seconds from the start of lasing operation.
Figure 19:
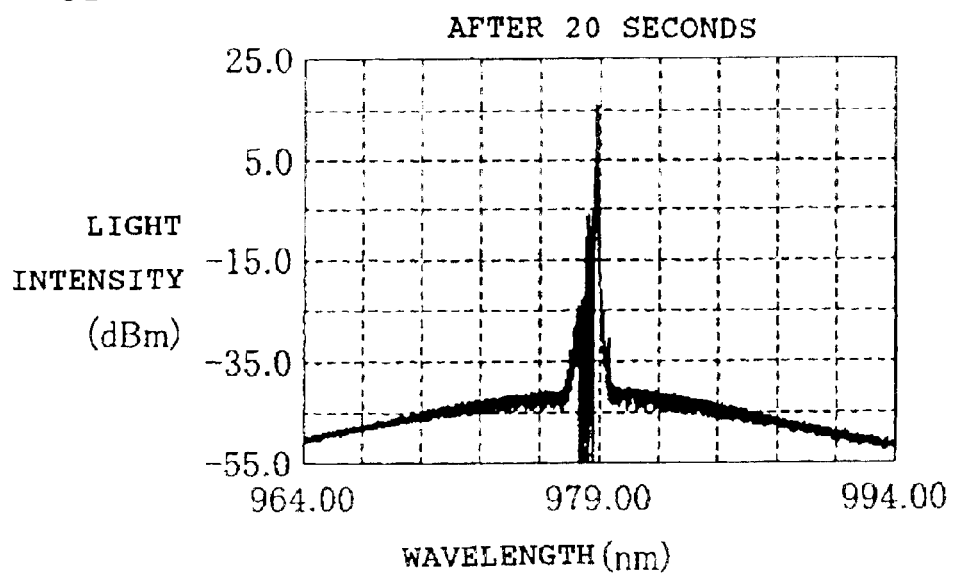
FIG. 19 is a spectrum diagram of the pumping laser light of a semiconductor laser device according to the prior art after 20 seconds from the start of lasing operation.
Figure 20:
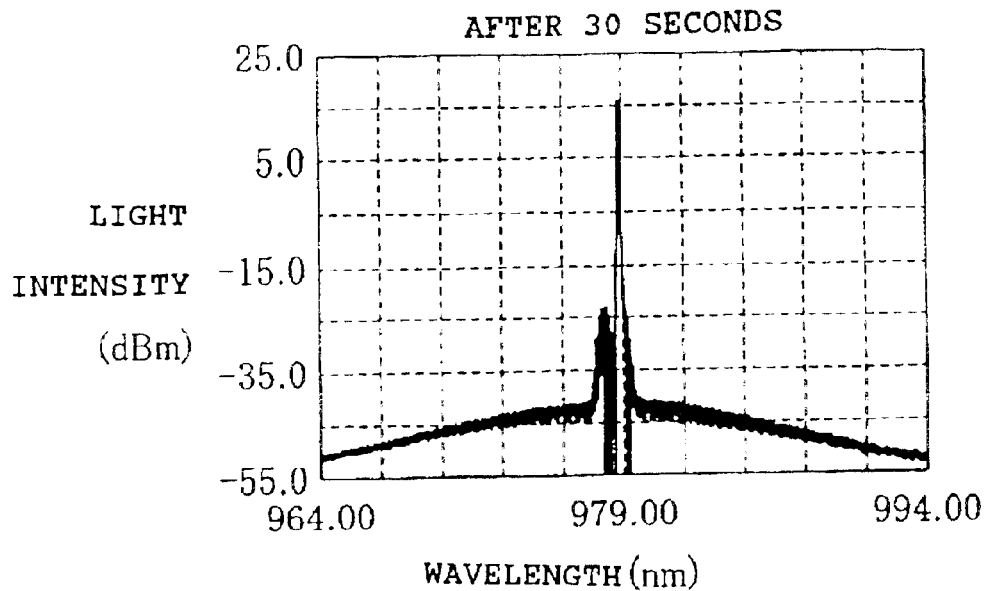
FIG. 20 is a spectrum diagram of the pumping laser light of a semiconductor laser device according to the prior art after 30 seconds from the start of lasing operation.
Figure 21:
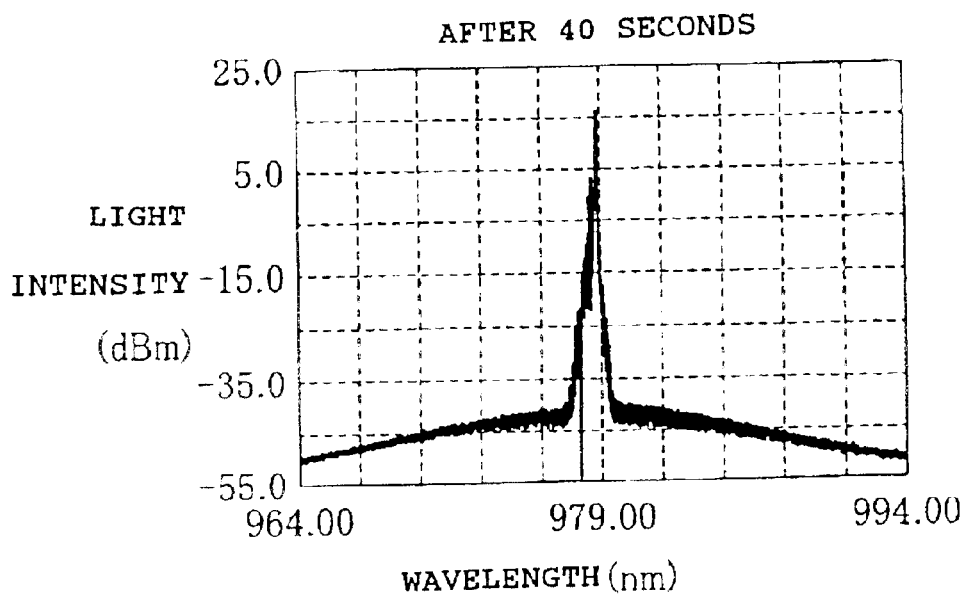
FIG. 21 is a spectrum diagram of the pumping laser light of a semiconductor laser device according to the prior art after 40 seconds from the start of lasing operation.
Figure 22:
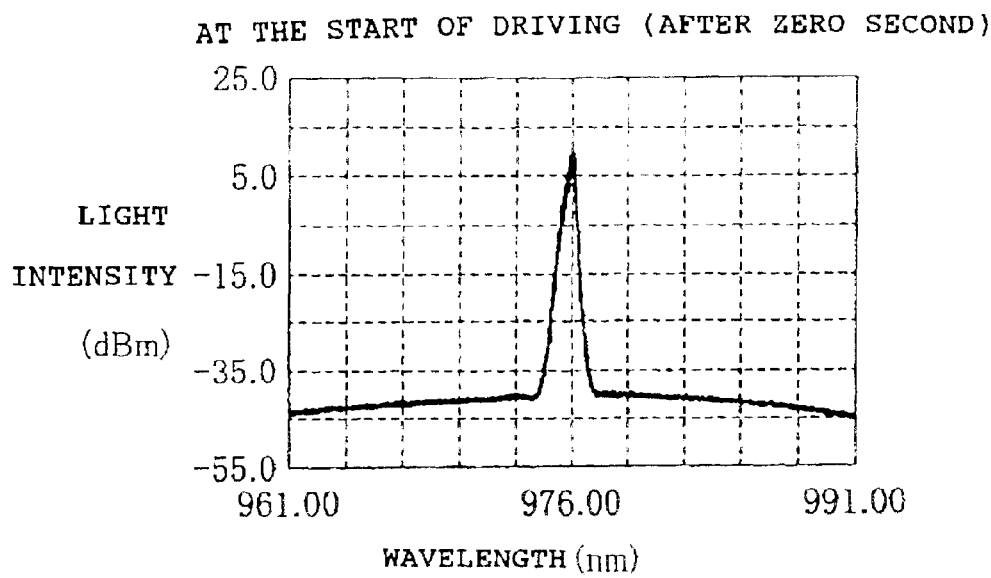
FIG. 22 is a spectrum diagram of pumping laser light of a semiconductor laser device according to the present invention at the start of lasing operation.
Figure 23:
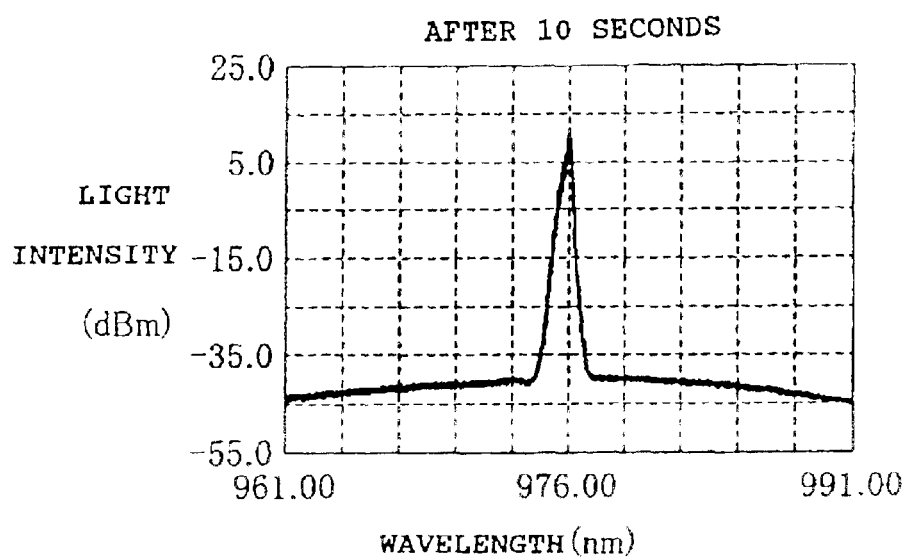
FIG. 23 is a spectrum diagram of the pumping laser light of a semiconductor laser device according to the present invention after ten seconds from the start of lasing operation.
Figure 24:
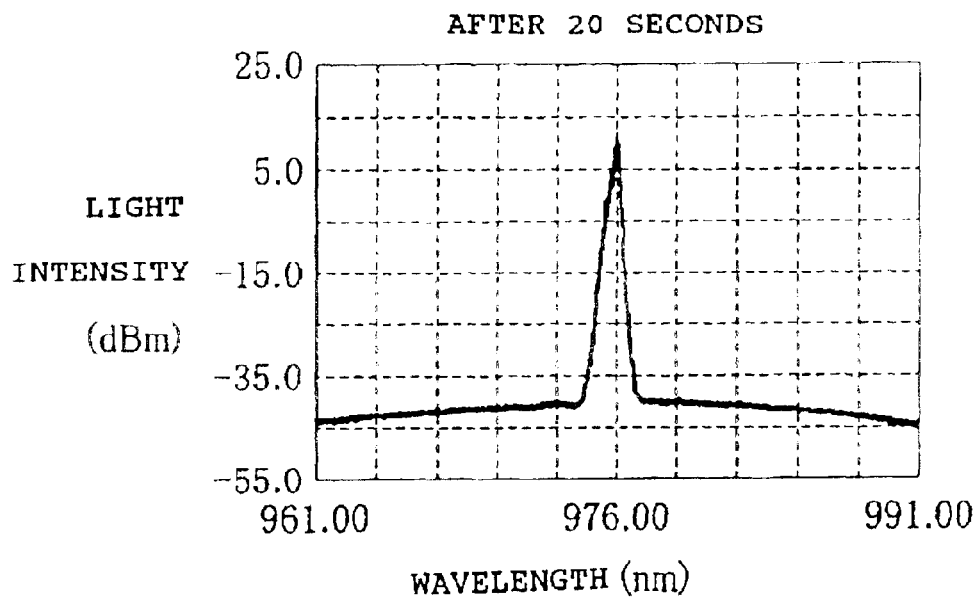
FIG. 24 is a spectrum diagram of the pumping laser light of a semiconductor laser device according to the present invention after 20 seconds from the start of driving the apparatus B.
Figure 25:
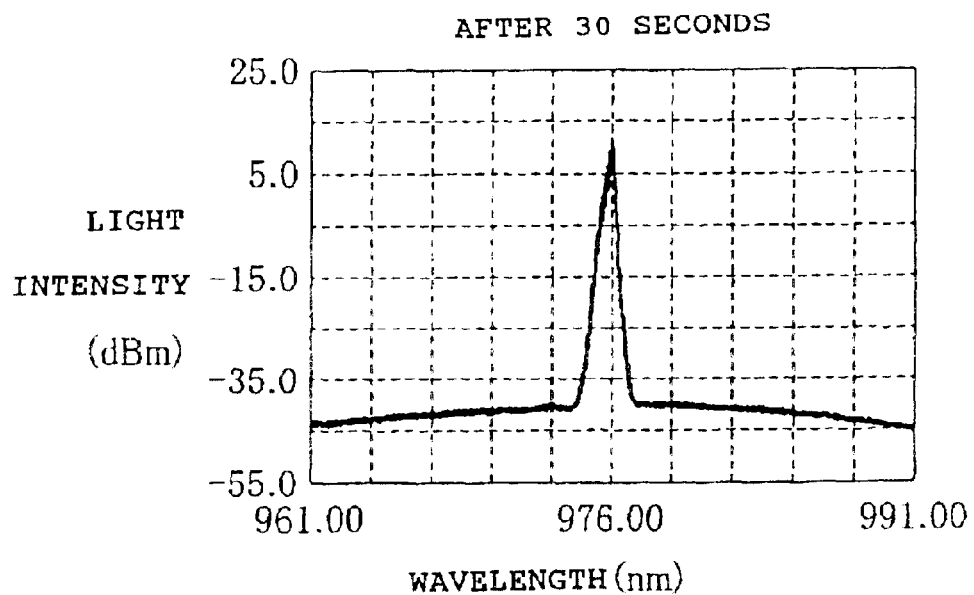
FIG. 25 is a spectrum diagram of the pumping laser light of a semiconductor laser device according to the present invention after 30 seconds from the start of lasing operation.
Figure 26:
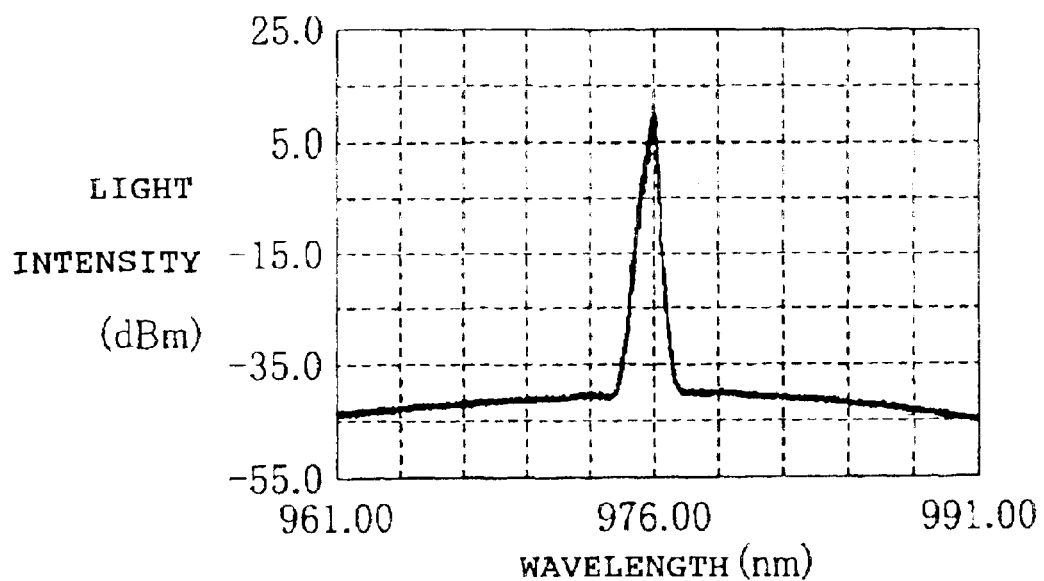
FIG. 26 is a spectrum diagram of the pumping laser light of a semiconductor laser device according to the present invention after 40 seconds from the start of lasing operation.

Driving currents to Apparatus $A_1$ and Apparatus $A_2$ were increased in increments of 5 mA, starting from the threshold level Ith, and the light power (Pf) of the pumping laser light and monitored optical currents (Im) were measured by the measuring system used above in section (1). Each time the driving current was incremented, the rates of change (in terms of percentage %) for Pf and Im were calculated:

FIG. 15 shows the result obtained from Apparatus $A_1$, and FIG. 16 shows the result obtained from Apparatus $A_2$. As is apparent from a comparison of FIG. 15 with FIG. 16, Apparatus $A_1$ has large fluctuations in Pf and Im as the driving current is changed, whereas Apparatus $A_2$ does not have any fluctuation in Pf or Im, and emits extremely stable pumping laser light even if the driving current is changed. An acceptable maximum rate of change of 0.5% is indicated in each of FIGS. 15 and 16.

(3) Stability of Spectrum of Pumping Laser Light over Time

Apparatus $A_1$ and Apparatus $A_2$ were injected with a driving current of 250 mA to emit pumping laser light. Then, the spectra were observed at the start of driving, and 10 seconds, 20 seconds, 30 seconds and 40 seconds after the start of driving.

FIGS. 17 through 21 show the results of the observation obtained from Apparatus $A_1$, and FIGS. 22 through 26 show the results from Apparatus $A_2$.

From the foregoing results, the following are apparent.

[1] In comparison of the spectrum diagrams (FIGS. 17 and 22) of the pumping laser light emitted from Apparatus $A_1$ and Apparatus $A_2$ immediately after the start of driving, Apparatus $A_1$ is emitting in a single longitudinal mode with its center wavelength located near the center wavelength (979 nm) of the fiber Bragg grating. On the other hand, Apparatus $A_2$ is emitting in a multi longitudinal mode near the center wavelength (976 nm) of the fiber Bragg grating.

[2] The pumping laser light emitted from Apparatus $A_1$ exhibits a varying emission spectrum over time, whereas Apparatus $A_2$ maintains an emission spectrum which is substantially same as that at the start of driving (FIG. 17) over the 40 second time duration, and even longer.

[3] In other words, Apparatus $A_2$ is capable of emitting pumping laser light which excels in temporal stability.

(4) Relationship between Optical Power and the State of Optical Fiber (Physical Disturbance)

Apparatus $A_2$ was driven to emit laser light with an optical fiber which was turned three times with a diameter of approximately 100 mm. The emission spectrum in this event is shown in FIG. 27.

Next, the turning configuration of the optical fiber was changed, i.e., re-wound from the forgoing to three turns with a diameter of approximately 100 mm, and Apparatus $A_2$ was driven to emit laser light under the same conditions. The emission spectrum in this event is shown in FIG. 28.

Figure 27:
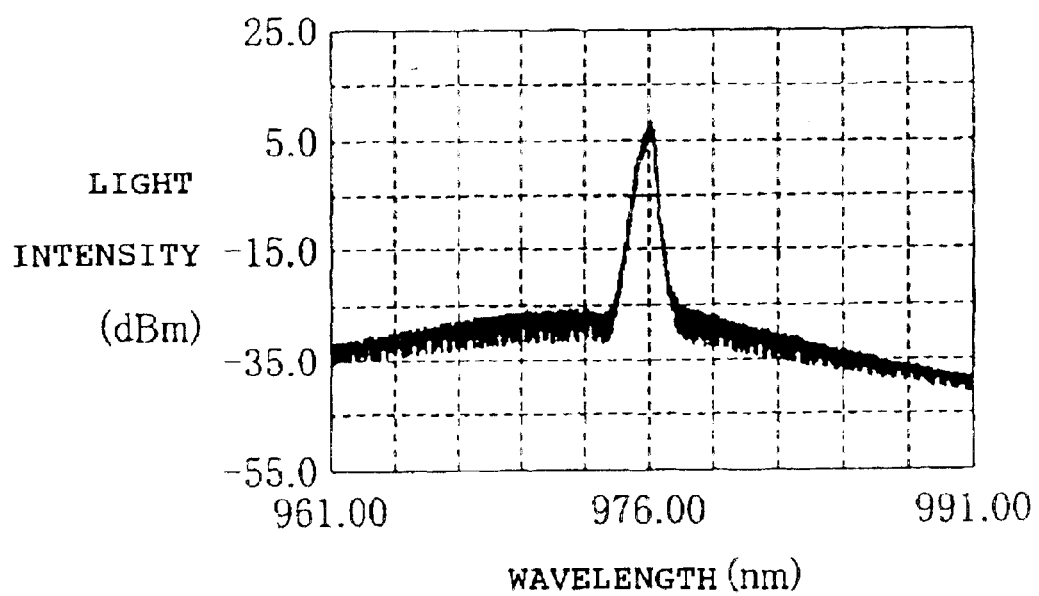
FIG. 27 is a spectrum diagram of the pumping laser light of a semiconductor laser module according to the present invention when the optical fiber coupled to the module's optical output is wound three times with a diameter of 100 mm.
Figure 28:
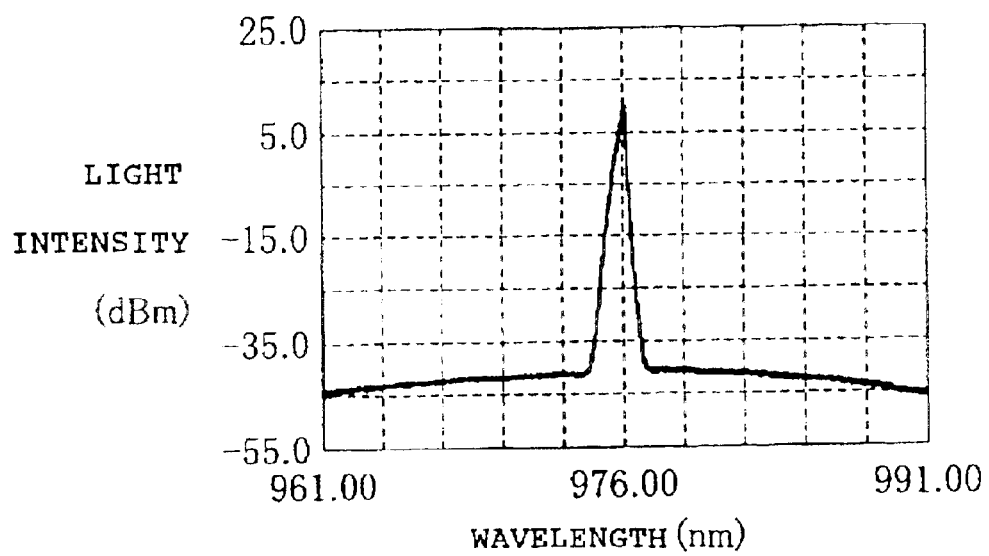
FIG. 28 is a spectrum diagram of the pumping laser light of the semiconductor laser module related to FIG. 27 in a modification where the optical fiber is re-wound three times with a diameter of 100 nm.

As is apparent from FIGS. 27 and 28, even a change in turning configuration of the optical fiber does not cause fluctuations in the emission spectrum of the pumping laser light from Apparatus $A_2$.

On the other hand, Apparatus $A_1$ was driven to emit laser light with an optical fiber which was turned five times with a diameter of approximately 100 mm. The emission spectrum in this event exhibited a multi-mode emission as shown in FIG. 29.

Next, the turning configuration of the optical fiber was changed from the foregoing to four turns with a diameter of approximately 100 mm, and Apparatus $A_1$ was driven to emit laser light under the same conditions. The emission spectrum in this event is shown in FIG. 30.

Figure 29:
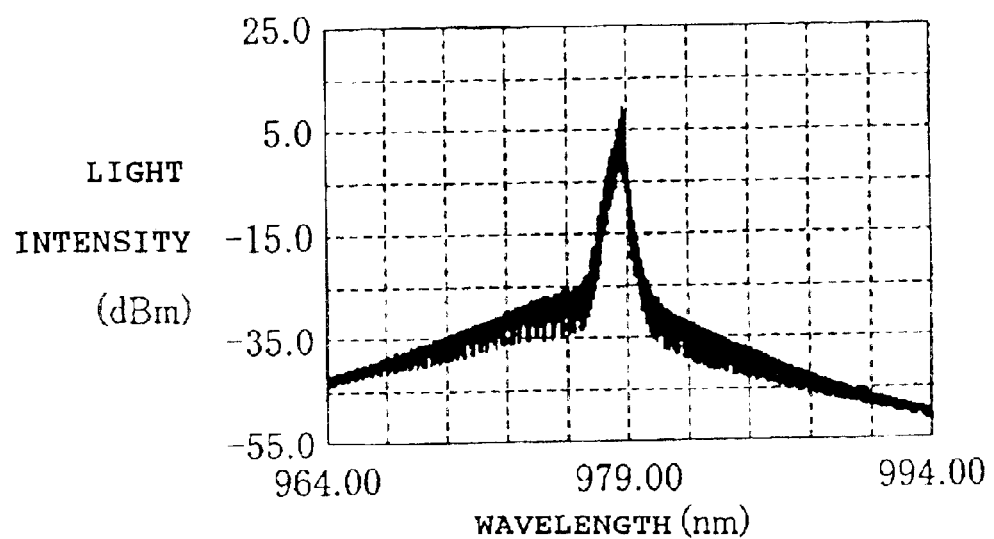
FIG. 29 is a spectrum diagram of the pumping laser light of a semiconductor laser module according to the prior art when the optical fiber coupled to the module's optical output is wound five times with a diameter of 100 nm.
Figure 30:
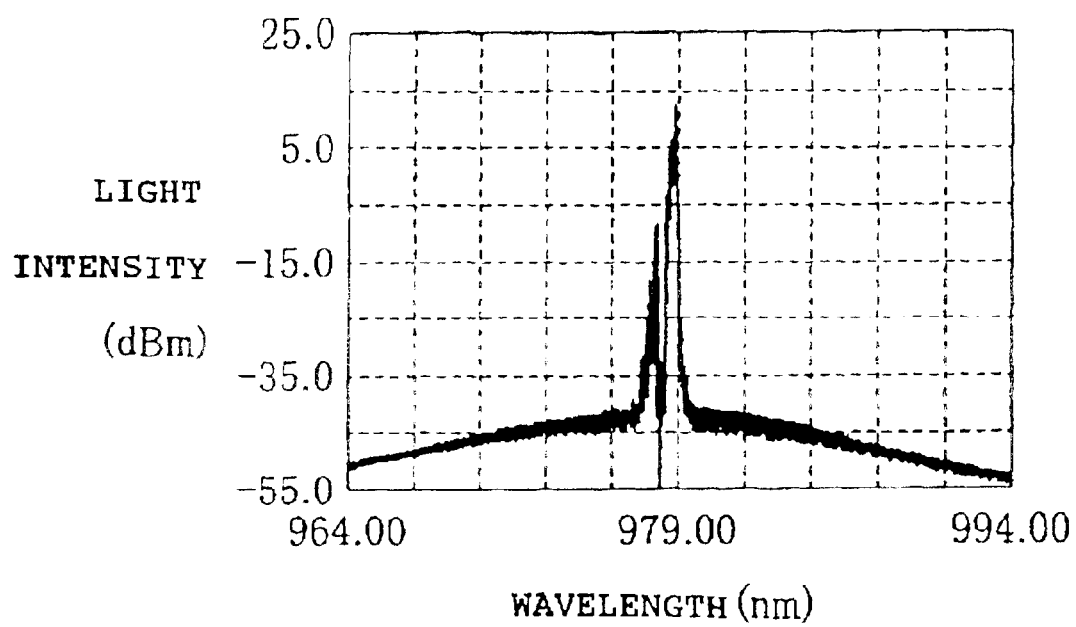
FIG. 30 is a spectrum diagram of the pumping laser light of the semiconductor laser module related to FIG. 29 in a modification where the optical fiber is re-wound four times with a diameter of 100 nm.

As is apparent from a comparison of FIG. 29 with FIG. 30, a change in the turning configuration of the optical fiber causes Apparatus $A_1$ to change the emission spectrum of the pumping laser light.

Thus, it has been found that Apparatus $A_2$ emits stable pumping laser light even in any turning configurations of the optical fiber, in more general terms, whichever state the optical fiber is placed in.

As described above, the laser module according to the present invention has a well layer of 10 nm thick or more, which is thicker than conventional laser modules, an active layer doped with an impurity, and a cladding layer doped with an n-type impurity. The laser module is assembled by optically coupling a laser device, which emits multi-moded emitted laser light, and a fiber Bragg grating, so that the laser module excels in the temporal stability of pumping laser light emitted therefrom. Also, the pumping laser light emitted from the laser module is stable even if a driving current of the laser device fluctuates. Further, the emitted pumping laser light is stable even if an optical fiber is changed, for example, in turning configuration, so that the laser module according to the present invention is highly reliable in practical use.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiment(s), it is to be understood that the present invention is not limited to the disclosed embodiment(s) but, on the contrary, is intended to cover various modifications and equivalent arrangements included within the scope of the appended claims.

What is claimed is:

1. A semiconductor pumping laser component comprising:
   a semiconductor pumping laser device having a layered structure formed on a surface of a Gallium-Arsenide substrate and a resonator cavity including at least a portion of said layered structure and having its propagation axis oriented parallel to the surface of the Gallium-Arsenide substrate, said layered structure having an active layer with a quantum well structure with at least a portion thereof disposed within said resonator cavity, said active layer formed of one or more semiconductor materials, each such material including at least Gallium and Arsenide, said quantum well structure comprising at least one well layer having a thickness of 10 nm or more and at least one barrier layer, said resonator cavity and layered structure providing a spacing interval ($\Delta\lambda_{FP}$) of longitudinal modes for light propagating along the resonator's propagation axis; and
   a light feedback element optically coupled to the light generated by said semiconductor pumping laser device, said light feedback element having a reflectivity bandwidth that is greater than or equal to twice the spacing interval of longitudinal modes; and
   wherein said semiconductor pumping laser component generates light having a plurality of the longitudinal modes; and
   wherein the at least one well layer of said quantum well structure provides stable oscillation of said plurality of longitudinal modes.

2. The semiconductor pumping laser component according to claim 1, wherein the thickness of the at least one well layer is less than or equal to 20 nm.

3. The semiconductor pumping laser component according to claim 1, wherein the thickness of the at least one well layer is in a range spanning from 12 nm to 15 nm.

4. The semiconductor pumping laser component according to claim 1, wherein the at least one well layer has a compressive strain with respect to the Gallium-Arsenide substrate, said compressive strain being in the range spanning from 0.5% to 1.5%.

5. The semiconductor pumping laser component according to claim 1, wherein the at least one well layer has a compressive strain with respect to the Gallium-Arsenide substrate, said compressive strain being in the range spanning from 1.0% to 1.5%.

6. The semiconductor pumping laser component according to claim 1, wherein at least said active layer is doped with an impurity.

7. The semiconductor pumping laser component according to claim 6, wherein said impurity is an n-type impurity.

8. The semiconductor pumping laser component according to claim 7, wherein said n-type impurity is Silicon.

9. The semiconductor pumping laser component according to claim 8, wherein said silicon impurity is doped in a concentration ranging from $1\times10^{16}$ to $5\times10^{18}/cm^3$.

10. The semiconductor pumping laser component according to claim 8, wherein said silicon impurity is doped in a concentration ranging from $5\times10^{16}$ to $1\times10^{18}/cm^3$.

11. The semiconductor pumping laser component according to claim 8, wherein said silicon impurity is doped in a concentration ranging from $2\times10^{17}$ to $8\times10^{17}/cm^3$.

12. The semiconductor pumping laser component according to claim 1, wherein the layered structure of the pumping laser diode comprises an n-type cladding layer, and wherein the n-type cladding layer is doped with at least silicon.

13. The semiconductor pumping laser component according to claim 6, wherein the layered structure of the pumping laser diode comprises an n-type cladding layer, and wherein the n-type cladding layer is doped with at least silicon.

14. The semiconductor pumping laser component according to claim 1, wherein said layered structure further comprises an adjacent semiconductor layer which is adjacent to one of the surfaces of the active layer, said adjacent semiconductor layer being doped with an impurity.

15. The semiconductor pumping laser component according to claim 1, wherein said quantum well structure comprises a single well layer.

16. The semiconductor pumping laser component according to claim 1, wherein each semiconductor material of said active layer comprises at least one of compounds of GaAs, $In_xGa_{1-x}As$, $GaAs_ySb_{1-y}$ and $In_xGa_{1-x}As_ySb_{1-y}$, $In_xGa_{1-x}As_zP_{1-z}$, $InxGa_{1-x}As_ySb_zP_{1-y-z}$, and $GaAs_ySb_zP_{1-y-z}$, where x, y, and z are stoichiometric parameters which range between 0 and 0.99.

17. The semiconductor pumping laser component according to claim 1, wherein the at least one well layer comprises a first amount of group-III atoms and a second amount of group-V atoms, said first amount of group-III atoms including at least gallium (Ga) and said second amount of group-V atoms including at least arsenic (As), said at least one well layer further including indium (In) with an atomic ratio of 0.20 or less with respect to the amount of group-III atoms.

18. The semiconductor pumping laser component according to claim 1 wherein the at least one well layer is a first well layer and the at least one barrier layer is a first barrier layer, wherein said quantum well structure further comprises a second well layer with the first barrier layer being disposed between the first and second well layers; and
   wherein the first barrier layer has a thickness $T_{B1}$, wherein the first well layer has a thickness $T_{W1}$ which is greater than thickness $T_{B1}$, and wherein the second well layer has a thickness $T_{W2}$ which is greater than thickness $T_{B1}$.

19. The semiconductor pumping laser component of claim 18 wherein the thickness $T_{B1}$ is equal to or greater than 10 nm.

20. The semiconductor pumping laser component of claim 18 wherein thickness $T_{W1}$ is in a range spanning from 10 nm to 20 nm, and wherein thickness $T_{W2}$ is in a range spanning from 10 nm to 20 nm.

21. The semiconductor pumping laser component according to claim 1, wherein said semiconductor pumping laser device comprises a ridge waveguide pumping laser device or a self-alignment pumping laser device.

22. The semiconductor pumping laser component according to claim 1, wherein the refractive index for light propagating along the propagation axis is substantially uniform for a distance of at least 400 μm along the length of the propagation axis, and wherein the light generated by the semiconductor layer comprises either a single transverse electric (TE) mode or a single transverse magnetic (TM) mode.

23. The semiconductor pumping laser component according to claim 1 wherein the resonator cavity has a front facet and a back facet, wherein the front facet has a reflectivity of 4% or less as measured at the wavelength of the light generated by the semiconductor pumping laser, and wherein the back facet has a reflectivity of 90% or more as measured at the wavelength of the light generated by the semiconductor pumping laser.

24. The semiconductor pumping laser component according to claim 1 wherein emitted pumping laser light from said semiconductor pumping laser device is emitted at a wavelength ranging from 940 nm to 990 nm.

25. The semiconductor pumping laser component according to claim 1, wherein said active layer has a peak in its photoluminescence spectrum in the wavelength range of 940 nm to 990 nm.

26. The semiconductor pumping laser component according to claim 1, wherein the semiconductor pumping laser device has a divergence angle of emitted light to the vertical axis of the far-field emission pattern, the divergence angle being defined from the front facet of the pumping laser to the full width between the half-power points on the vertical axis of the far-field emission pattern, and wherein the divergence angle has a value of 25° or less.

27. The semiconductor pumping laser component according to claim 1, wherein the pumping laser device has a threshold current Ith and an amplified spontaneous emission spectrum for injection currents having values below Ith, the amplified spontaneous emission spectrum having a maximum power point, two −3 dB points on either side of the maximum power point, and a spectral width Δλ between the two −3 dB points; and
    wherein the spectral width Δλ is equal to 15 nm or more for injection currents which are greater than or equal to 0.2.Ith and less than or equal to 0.8.Ith.

28. The semiconductor pumping laser component according to claim 27, wherein the amplified spontaneous emission spectrum further has two −6 dB points on either side of the maximum power point, and
    wherein the general shape of the amplified spontaneous emission spectrum between the two −6 dB points is convex for at least one injection current in the range spanning from 0.2.Ith to 0.8.Ith.

29. The semiconductor pumping laser component according to claim 1 wherein the resonator cavity has a front facet, a back facet, and a cavity length L between the front and back facets, and wherein the semiconductor pumping laser device generates an output power equal to or greater than the quantity (0.1 mW/μm).L.

30. The semiconductor pumping laser component according to claim 1, wherein said light feedback element comprises at least one of a fiber Bragg grating, a dielectric multi-layered filter, or a distributed Bragg reflector.

31. The semiconductor pumping laser component according to claim 1, wherein said light feedback element comprises a fiber Bragg grating formed on an optical fiber which has a wedge-shaped end.

32. The semiconductor pumping laser component according to claim 1, wherein said light feedback element is formed separately from the semiconductor pumping laser diode.

33. The semiconductor pumping laser component according to claim 1, wherein said light feedback element is formed on the same Gallium-Arsenide substrate as the semiconductor pumping laser diode.

34. The semiconductor pumping laser component according to claim 33, wherein said light feedback element comprises a grating formed adjacent to a portion of said active layer.

35. A semiconductor pumping laser component comprising:
    a semiconductor pumping laser diode having a layered structure formed on a surface of a Gallium-Arsenide substrate and a resonator cavity including at least a portion of said layered structure and having its propagation axis oriented parallel to the surface of the Gallium-Arsenide substrate, said layered structure having an active layer with a quantum well structure with at least a portion thereof disposed within said resonator cavity, said active layer formed from one or more semiconductor materials, each such material including at least Ga and As, said quantum well structure comprising at least one well layer having a thickness $T_W$ and at least one barrier layer having a thickness of $T_B$ less than or equal to $T_W$, said resonator cavity and layered structure providing a spacing interval ($\Delta\lambda_{FP}$) of longitudinal modes for light propagating along the resonator's propagation axis; and
    a light feedback element optically coupled to the light generated by said semiconductor pumping laser diode, said light feedback element having a reflectivity bandwidth that is greater than or equal to twice the spacing interval of longitudinal modes; and
    wherein said semiconductor pumping laser component generates light having a plurality of the longitudinal modes; and
    wherein the relative thickness of the at least one well layer and the at least one barrier layer provides stable oscillation of said plurality of longitudinal modes.

36. The semiconductor pumping laser component of claim 35 wherein thickness Tw is in a range spanning from 10 nm to 20 nm.

37. The semiconductor pumping laser component according to claim 35, wherein the thickness of the at least one well layer is in a range spanning from 12 nm to 15 nm.

38. The semiconductor pumping laser component according to claim 35, wherein the thickness TB is equal to or greater than 10 nm.

39. The semiconductor pumping laser component according to claim 35, wherein the at least one well layer has a compressive strain with respect to the Gallium-Arsenide substrate, said compressive strain being in the range spanning from 0.5% to 1.5%.

40. The semiconductor pumping laser component according to claim 35, wherein at least said active layer is doped with an impurity.

41. The semiconductor pumping laser component according to claim 40, wherein said impurity is an n-type impurity.

42. The semiconductor pumping laser component according to claim 41, wherein said n-type impurity is silicon.

43. The semiconductor pumping laser component according to claim 42, wherein said silicon impurity is doped in a concentration ranging from $1\times10^{16}$ to $5\times10^{18}/cm^3$.

44. The semiconductor pumping laser component according to claim 42, wherein said silicon impurity is doped in a concentration ranging from $5 \times 10^{16}$ to $1 \times 10^{18}/cm^3$.

45. The semiconductor pumping laser component according to claim 35, wherein each semiconductor material of said active layer comprises at least one of compounds of GaAs, $In_xGa_{1-x}As$, $GaAs_ySb_{1-y}$ and $In_xGa_{1-x}As_ySb_{1-y}$, $In_xGa_{1-x}As_zP_{1-z}$, $In_xGa_{1-x}As_ySb_zP_{1-y-z}$, and $GaAs_ySb_zP_{1-y-z}$, where x, y, and z are stoichiometric parameters which range between 0 and 0.99.

46. The semiconductor pumping laser component according to claim 35, wherein the at least one well layer comprises a first amount of group-III atoms and a second amount of group-V atoms, said first amount of group-III atoms including at least gallium (Ga) and said second amount of group-V atoms including at least arsenic (As), said at least one well layer further including indium (In) with an atomic ratio of 0.20 or less with respect to the amount of group-III atoms.

47. The semiconductor pumping laser component according to claim 35 wherein the at least one well layer is a first well layer with the thickness $T_W$, wherein the at least one barrier layer is a first barrier layer with the thickness $T_B$, wherein said quantum well structure further comprises a second well layer with the first barrier layer being disposed between the first and second well layers; and wherein the second well layer has a thickness $TW_2$ which is greater than thickness $T_B$.

48. The semiconductor pumping laser component of claim 47 wherein the thickness $T_{B1}$ is equal to or greater than 10 nm.

49. The semiconductor pumping laser component according to claim 35, wherein said semiconductor pumping laser device comprises a ridge waveguide pumping laser device or a self-alignment pumping laser device.

50. The semiconductor pumping laser component according to claim 35 wherein emitted pumping laser light from said semiconductor pumping laser device is emitted at a wavelength ranging from 940 nm to 990 nm.

51. The semiconductor pumping laser component according to claim 35, wherein said active layer has a peak in its photoluminescence spectrum in the wavelength range of 940 nm to 990 nm.

52. The semiconductor pumping laser component according to claim 35, wherein the semiconductor device has a divergence angle of emitted light the vertical axis of the far-field emission pattern, the divergence angle being defined from the front facet of the pumping laser to the full width between the half-power points on the vertical axis of the far-field emission pattern, and wherein the divergence angle has a value of 25° or less.

53. The semiconductor pumping laser component according to claim 35, wherein the pumping laser device has a threshold current Ith and an amplified spontaneous emission spectrum for injection currents having values below Ith, the amplified spontaneous emission spectrum having a maximum power point, two −3 dB points on either side of the maximum power point, and a spectral width $\Delta\lambda$ between the two −3 dB points; and wherein the spectral width $\Delta\lambda$ is equal to 15 nm or more for injection currents which are greater than or equal to 0.2-Ith and less than or equal to 0.8-Ith.

54. The semiconductor pumping laser component according to claim 53, wherein the amplified spontaneous emission spectrum further has two −6 dB points on either side of the maximum power point, and wherein the general shape of the amplified spontaneous emission spectrum between the two −6 dB points is convex for at least one injection current in the range spanning from 0.2-Ith to 0.8-Ith.

55. The semiconductor pumping laser component according to claim 35, wherein said light feedback element comprises at least one of a fiber Bragg grating, a dielectric multi-layered filter, or a distributed Bragg reflector.

\* \* \* \* \*